US011417273B2

(12) United States Patent
Toyotaka et al.

(10) Patent No.: US 11,417,273 B2
(45) Date of Patent: Aug. 16, 2022

(54) SEMICONDUCTOR DEVICE, DISPLAY DEVICE, ELECTRONIC DEVICE, AND OPERATION METHOD

(71) Applicant: Semiconductor Energy Laboratory Co., Ltd., Atsugi (JP)

(72) Inventors: Kouhei Toyotaka, Atsugi (JP); Kei Takahashi, Isehara (JP); Susumu Kawashima, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/765,496

(22) PCT Filed: Dec. 4, 2018

(86) PCT No.: PCT/IB2018/059593
§ 371 (c)(1),
(2) Date: May 20, 2020

(87) PCT Pub. No.: WO2019/111137
PCT Pub. Date: Jun. 13, 2019

(65) Prior Publication Data
US 2020/0320930 A1 Oct. 8, 2020

(30) Foreign Application Priority Data

Dec. 6, 2017 (JP) .............................. JP2017-233931
Feb. 8, 2018 (JP) .............................. JP2018-020851
Nov. 29, 2018 (JP) .............................. JP2018-224142

(51) Int. Cl.
*G06F 3/038* (2013.01)
*G09G 3/3233* (2016.01)
(Continued)

(52) U.S. Cl.
CPC ......... *G09G 3/3233* (2013.01); *H01L 27/323* (2013.01); *H01L 27/3262* (2013.01);
(Continued)

(58) Field of Classification Search
USPC .................. 345/78, 214, 690, 691, 209, 211; 315/224
See application file for complete search history.

(56) References Cited

U.S. PATENT DOCUMENTS 8,476,625 B2 7/2013 Kimura
8,659,519 B2 2/2014 Abe et al.
(Continued)

FOREIGN PATENT DOCUMENTS

CN 102737586 A 10/2012
CN 104064149 A 9/2014
(Continued)

OTHER PUBLICATIONS

Amano.S et al., "Low Power LC Display Using In—Ga—Zn-Oxide TFTs Based on Variable Frame Frequency", SID Digest '10 : SID International Symposium Digest Of Technical Papers, May 23, 2010, vol. 41, No. 1, pp. 626-629.
(Continued)

*Primary Examiner* — Thuy N Pardo
(74) *Attorney, Agent, or Firm* — Robinson Intellectual Property Law Office; Eric J. Robinson

(57) ABSTRACT

A semiconductor device that reduces variations in the characteristics of driving transistors and corrects image data is provided. The semiconductor device includes an image data retention portion, a correction data retention portion, a driver circuit portion, a display element, and a threshold voltage correction circuit portion. The image data retention portion has a function of retaining first image data, and the correction data retention portion has a function of retaining cor-
(Continued)

US 11,417,273 B2

Page 2 rection data, and a function of generating second image data corresponding to the first image data and the correction data when the first image data is retained in the image data retention portion. The driver circuit portion has a function of generating a current corresponding to the second image data and feeding the current to the display element, and the threshold voltage correction circuit portion has a function of correcting a threshold voltage of a driving transistor in the driver circuit portion. With the above structure, the semiconductor device can correct the image data, correct the threshold voltage of the driving transistor, and perform display based on the second image data.

16 Claims, 21 Drawing Sheets

(51) Int. Cl.
  *H01L 27/32* (2006.01)
  *H01L 27/12* (2006.01)
  *H01L 29/786* (2006.01)
(52) U.S. Cl.
  CPC .. *G09G 2300/0819* (2013.01); *H01L 27/1225* (2013.01); *H01L 27/1255* (2013.01); *H01L 29/7869* (2013.01); *H01L 29/78648* (2013.01)

(56) References Cited

U.S. PATENT DOCUMENTS

| | | | |
|---|---|---|---|
| 8,957,889 B2 | 2/2015 | Miyake | |
| 8,975,709 B2 | 3/2015 | Miyake | |
| 9,184,210 B2 * | 11/2015 | Koyama | G09G 3/20 |
| 9,305,494 B2 | 4/2016 | Shim et al. | |
| 9,305,988 B2 | 4/2016 | Miyake | |
| 9,508,709 B2 | 11/2016 | Miyake | |
| 9,779,658 B2 | 10/2017 | Kuo | |
| 9,853,068 B2 | 12/2017 | Miyake | |
| 10,002,972 B2 | 6/2018 | Miyake | |
| 10,032,798 B2 | 7/2018 | Miyake | |
| 10,170,565 B2 * | 1/2019 | Yoneda | H04N 5/3651 |
| 10,453,873 B2 | 10/2019 | Miyake | |
| 10,622,380 B2 | 4/2020 | Miyake | |
| 2010/0053041 A1 | 3/2010 | Abe et al. | |
| 2012/0249509 A1 | 10/2012 | Kim et al. | |
| 2013/0063413 A1 | 3/2013 | Miyake | |
| 2013/0069068 A1 | 3/2013 | Miyake | |
| 2013/0241431 A1 * | 9/2013 | Toyotaka | H05B 47/10 315/224 |
| 2013/0321371 A1 * | 12/2013 | Koyama | G09G 3/20 345/209 |
| 2014/0111563 A1 * | 4/2014 | Hwang | H04N 13/398 345/691 |
| 2014/0375699 A1 * | 12/2014 | Park | G09G 3/3283 345/690 |
| 2015/0171156 A1 | 6/2015 | Miyake | |
| 2015/0187276 A1 | 7/2015 | Shim et al. | |
| 2015/0294625 A1 * | 10/2015 | Lee | G09G 3/3233 345/691 |
| 2016/0104419 A1 * | 4/2016 | Chung | G09G 3/3225 345/78 |
| 2016/0267844 A1 * | 9/2016 | Senda | G09G 3/3291 |
| 2016/0316159 A1 * | 10/2016 | Yoneda | H01L 27/14665 |
| 2017/0032743 A1 * | 2/2017 | Lee | G09G 3/3233 |
| 2017/0103708 A1 * | 4/2017 | Kim | G09G 3/3233 |
| 2017/0110052 A1 * | 4/2017 | Kuo | G09G 3/30 |
| 2017/0179160 A1 * | 6/2017 | Takahashi | G09G 3/2092 |
| 2017/0193912 A1 * | 7/2017 | Choi | G09G 3/3291 |
| 2017/0221417 A1 * | 8/2017 | Jung | G09G 3/3648 |
| 2019/0206899 A1 * | 7/2019 | Takahashi | H01L 27/1225 |
| 2020/0193928 A1 | 6/2020 | Kawashima et al. | |
| 2020/0194527 A1 | 6/2020 | Kawashima et al. | |
| 2020/0251054 A1 * | 8/2020 | Inoue | H01L 27/1225 |

FOREIGN PATENT DOCUMENTS

| | | |
|---|---|---|
| CN | 104751781 A | 7/2015 |
| EP | 2161706 A | 3/2010 |
| EP | 2506247 A | 10/2012 |
| EP | 2889862 A | 7/2015 |
| JP | 2010-060816 A | 3/2010 |
| JP | 2010-156963 A | 7/2010 |
| JP | 2013-076994 A | 4/2013 |
| JP | 2013-077814 A | 4/2013 |
| JP | 2015-129926 A | 7/2015 |
| JP | 2015-129934 A | 7/2015 |
| JP | 2015-132816 A | 7/2015 |
| JP | 2017-010000 A | 1/2017 |
| KR | 2012-0110387 A | 10/2012 |
| KR | 2015-0077710 A | 7/2015 |
| WO | WO-2019/092549 | 5/2019 |

OTHER PUBLICATIONS

Yamazaki.S et al., "Research, Development, and Application of Crystalline Oxide Semiconductor", SID Digest '12 : SID International Symposium Digest Of Technical Papers, Jun. 5, 2012, vol. 43, No. 1, pp. 183-186.

Kato.K et al., "Evaluation of Off-State Current Characteristics of Transistor Using Oxide Semiconductor Material, Indium.Gallium. Zinc Oxide", Jpn. J. Appl. Phys. (Japanese Journal Of Applied Physics) , 2012, vol. 51, pp. 021201-1-021201-7.

Yamazaki.S et al., "Properties of crystalline In—Ga—Zn-oxide semiconductor and its transistor characteristics", Jpn. J. Appl. Phys. (Japanese Journal Of Applied Physics) , Mar. 31, 2014, vol. 53, No. 4S, pp. 04ED18-1-04ED18-10.

Yamazaki.S et al., "In—Ga—Zn-Oxide Semiconductor and Its Transistor Characteristics", ECS Journal Of Solid State Science And Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest Of Technical Papers, 2015, pp. T216-T217.

Ito.S et al., "Analysis of Nanoscale Crystalline Structure of In—Ga—Zn—O Thin Film with Nano Beam Electron Diffraction", AM-FPD '13 Digest Of Technical Papers, Jul. 2, 2013, pp. 151-154.

International Search Report (Application No. PCT/IB2018/059593) dated Mar. 12, 2019.

Written Opinion (Application No. PCT/IB2018/059593) dated Mar. 12, 2019.

Chinese Office Action (Application No. 201880077322.2) dated Feb. 16, 2022.

* cited by examiner

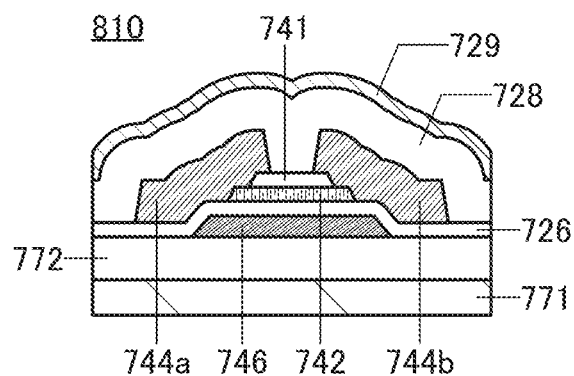
FIG. 14A1
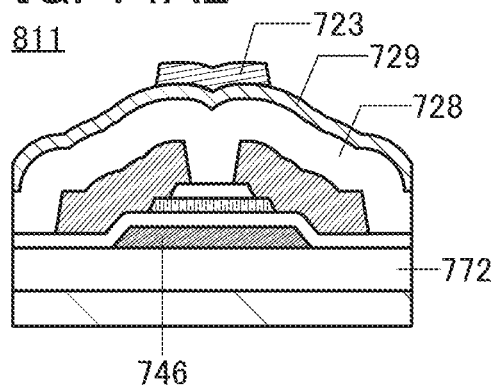
FIG. 14A2
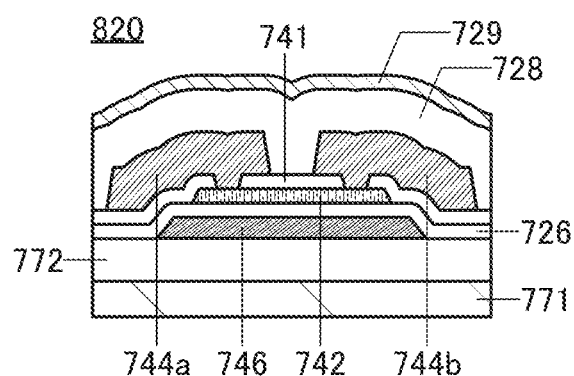
FIG. 14B1
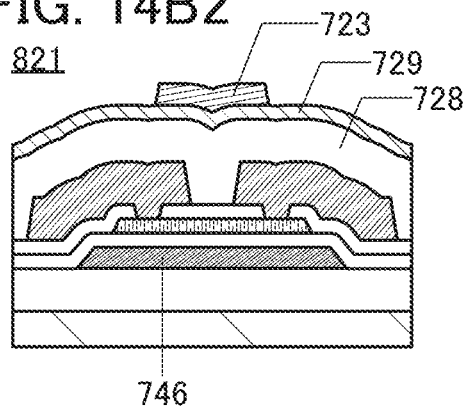
FIG. 14B2
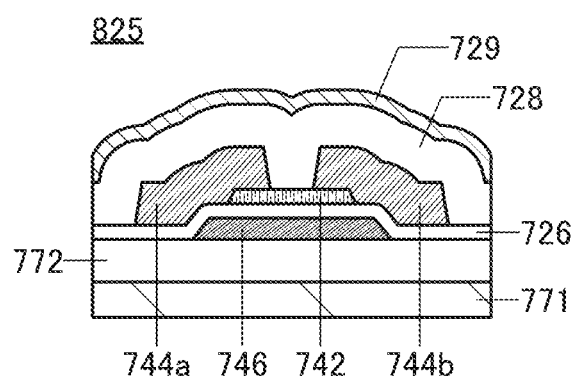
FIG. 14C1
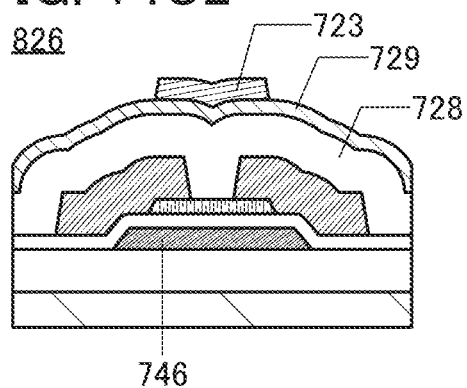
FIG. 14C2

FIG. 15A1
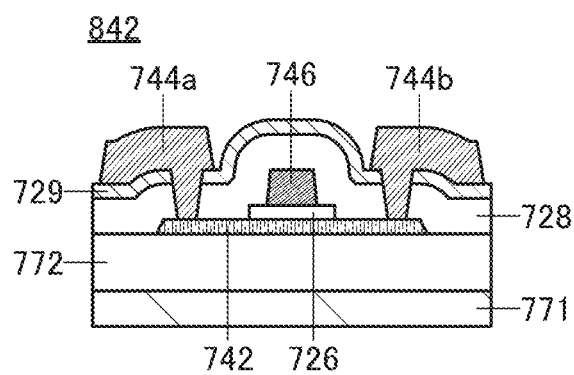
FIG. 15A2
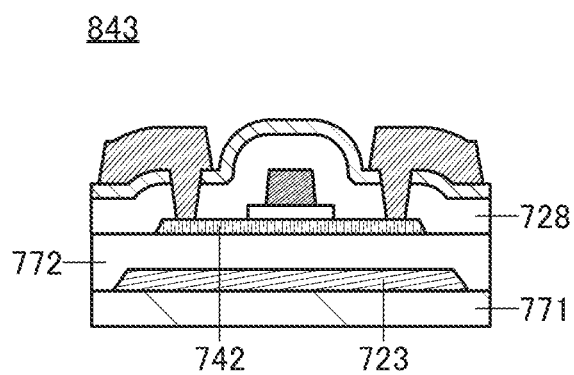
FIG. 15A3
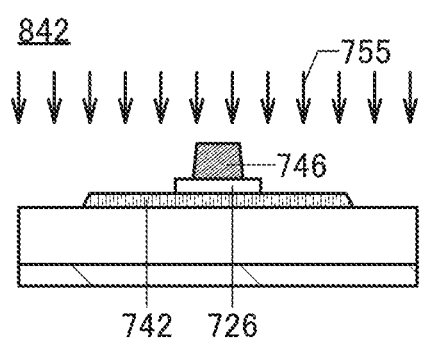
FIG. 15B1
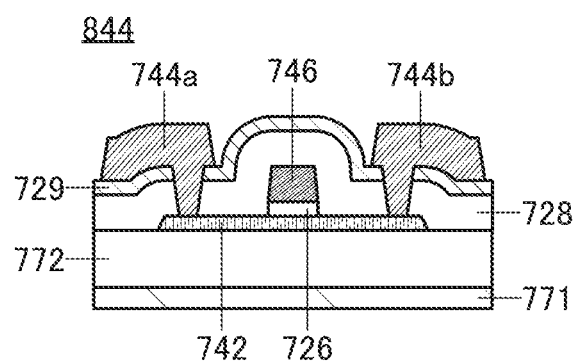
FIG. 15B2
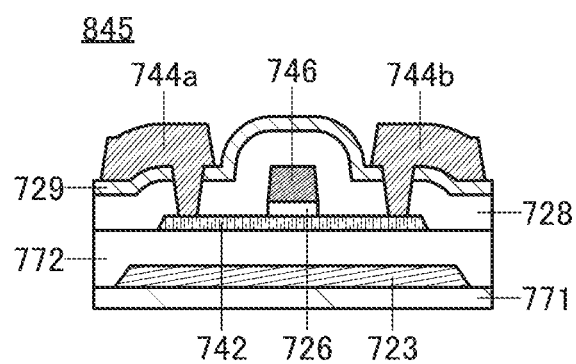
FIG. 15C1
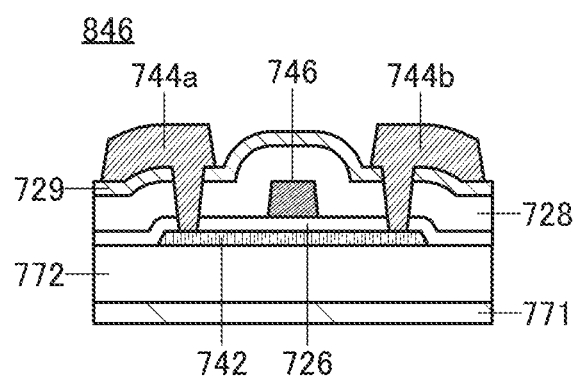
FIG. 15C2
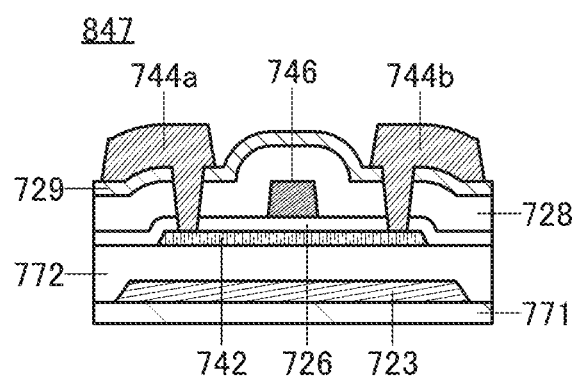

SEMICONDUCTOR DEVICE, DISPLAY DEVICE, ELECTRONIC DEVICE, AND OPERATION METHOD

TECHNICAL FIELD

One embodiment of the present invention relates to a semiconductor device, a display device, an electronic device, and an operation method.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a processor, an electronic device, a system, a method for driving them, a method for manufacturing them, and a method for testing them.

BACKGROUND ART

In recent years, display devices included in mobile phones such as smartphones, tablet information terminals, laptop PCs (personal computers), portable game consoles, and the like have undergone various improvements. For example, display devices have been developed aiming for higher resolution, higher color reproducibility, a smaller driver circuit, and lower power consumption. Furthermore, for example, a circuit for reducing variations in the characteristics of a driving transistor included in a pixel has been under development in order to improve the display quality of a display device. In particular, Patent Document 1 discloses the invention of a pixel circuit that includes a circuit for correcting the threshold voltage of a driving transistor.

There is also a technique of using a transistor, whose semiconductor thin film contains an oxide semiconductor, as a switching element included in a pixel circuit of a display device.

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display device utilizing the characteristics have been reported (see Non-Patent Document 7 and Non-Patent Document 8). Patent Document 2 discloses the invention in which a transistor including IGZO in an active layer is used in a pixel circuit of a display device.

PRIOR ART DOCUMENTS

Patent Documents

[Patent Document 1] Japanese Published Patent Application No. 2017-10000
[Patent Document 2] Japanese Published Patent Application No. 2010-156963

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

As a condition for displaying a high-quality image, a display device needs to have, for example, a high resolution, multi tones, and a wide color gamut. For example, in a display device including a light-emitting element such as an organic EL (Electro Luminescence) element, a reduction in variations in the characteristics of driving transistors and an appropriate correction of image data transmitted to a pixel are required to display a high-quality image.

An object of one embodiment of the present invention is to provide a pixel circuit (referred to as a semiconductor device in this specification and the like) that is capable of reducing variations in the characteristics of driving transistors and correcting image data. Another object of one embodiment of the present invention is to provide a display device including the semiconductor device. Another object of one embodiment of the present invention is to provide an electronic device including the display device. Another object of one embodiment of the present invention is to provide an operation method of the semiconductor device, the display device, and the electronic device.

Note that the objects of one embodiment of the present invention are not limited to the objects listed above. The objects listed above do not preclude the existence of other objects. The other objects are objects that are not described in this section and will be described below. The other objects that are not described in this section will be derived from the description of the specification, the drawings, and the like and can be extracted from these descriptions by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a semiconductor device including an image data retention portion, a correction data retention portion, a driver circuit portion, a display element, and a threshold voltage correction circuit portion; the driver circuit portion includes a first transistor having a back gate; a first terminal of the first transistor is electrically connected to an input terminal of the display element; the image data retention portion has a function of retaining first image data; the correction data retention portion has a function of retaining correction data and a function of generating second image data corresponding to the first image data and the correction data when the first image data is retained in the image data retention portion; the driver circuit portion has a function of generating a first current between the first terminal and a second terminal of the first transistor and feeding the first current to the display element when a first potential corresponding to the second image data is applied to a gate of the first transistor; and the threshold voltage correction circuit portion has a function of correcting a threshold voltage of the first transistor included in the driver circuit portion.

(2)

Another embodiment of the present invention is the semiconductor device with the above structure (1), which includes first to third capacitors; the image data retention portion includes a second transistor; the correction data retention portion includes a third transistor; a threshold voltage correction circuit includes a fourth transistor; a first terminal of the second transistor is electrically connected to a first terminal of the first capacitor; a first terminal of the third transistor is electrically connected to the gate of the first transistor, a second terminal of the first capacitor, and a first terminal of the second capacitor; the first terminal of the first transistor is electrically connected to a second terminal of the second capacitor and a first terminal of the third capacitor; and the back gate of the first transistor is electrically connected to a first terminal of the fourth transistor and a second terminal of the third capacitor.

(3)

Another embodiment of the present invention is the semiconductor device with the above structure (2), in which each of the first to fourth transistors includes one of a metal oxide and silicon in a channel formation region.

(4)

Another embodiment of the present invention is the semiconductor device with the above structure (2) or (3), in which the driver circuit portion includes a fifth transistor, and the first terminal of the third transistor and the input terminal of the display element are electrically connected through a first terminal and a second terminal of the fifth transistor.

(5)

Another embodiment of the present invention is the semiconductor device with the above structure (4), in which the fifth transistor includes one of a metal oxide and silicon in a channel formation region.

(6)

Another embodiment of the present invention is the semiconductor device with any one of the above structures (2) to (5), which includes a sixth transistor; a first terminal of the sixth transistor is electrically connected to the gate of the first transistor; and a second terminal of the sixth transistor is electrically connected to the first terminal of the first transistor.

(7)

Another embodiment of the present invention is the semiconductor device with the above structure (6), in which the sixth transistor includes one of a metal oxide and silicon in a channel formation region.

(8)

Another embodiment of the present invention is the semiconductor device with any one of the above structures (2) to (7), which includes a first function to a third function; the first function includes a function of turning on the third transistor and applying a first initialization potential to the gate of the first transistor, the second terminal of the first capacitor, and the first terminal of the second capacitor, a function of turning on the fourth transistor and applying a second initialization potential to the back gate of the first transistor, a function of applying a third initialization potential to the first terminal of the first transistor, the second terminal of the second capacitor, and the first terminal of the third capacitor, a function of turning off the third transistor and retaining a potential difference between the first initialization potential and the third initialization potential by the second capacitor, and a function of blocking a current from the first terminal of the first transistor to the input terminal of the display element, applying a voltage between the first terminal and the second terminal of the first transistor to turn on the first transistor, and then retaining a potential difference between the second initialization potential and a second potential by the third capacitor when a potential of the first terminal of the first transistor becomes the second potential and the first transistor is turned off; the second function includes a function of turning on the third transistor and writing a third potential corresponding to the correction data to the gate of the first transistor, the second terminal of the first capacitor, and the first terminal of the second capacitor, and a function of turning off the third transistor and retaining the third potential by the gate of the first transistor, the second terminal of the first capacitor, and the first terminal of the second capacitor; and the third function includes a function of turning on the second transistor and writing a fourth potential corresponding to the first image data to the first terminal of the first capacitor, and a function of changing the third potential retained by the gate of the first transistor, the second terminal of the first capacitor, and the first terminal of the second capacitor to the first potential corresponding to the second image data when the fourth potential is written to the first terminal of the first capacitor.

(9)

Another embodiment of the present invention is a display device including the semiconductor device with any one of the above structures (1) to (8), and a peripheral circuit.

(10)

Another embodiment of the present invention is an electronic device including the display device with the above structure (9), and a housing.

(11)

Another embodiment of the present invention is an operation method of a semiconductor device including an image data retention portion, a correction data retention portion, a driver circuit portion, a display element, and a threshold voltage correction circuit portion; the driver circuit portion includes a first transistor having a back gate; the operation method of the semiconductor device includes a threshold voltage correction period, a correction data writing period, an image data writing period, and an image display period; the threshold voltage correction period includes a period in which the threshold voltage correction circuit portion supplies a potential to the back gate of the first transistor to correct the threshold voltage of the first transistor; the correction data writing period includes a period in which correction data is written to the correction data retention portion; the image data writing period includes a period in which first image data is written to the image data retention portion and the correction data retention portion generates second image data corresponding to the first image data and the correction data; and the image display period includes a period in which a first potential corresponding to the second image data is applied to a gate of the first transistor, whereby the driver circuit portion generates a first current between a first terminal and a second terminal of the first transistor and feeds the first current to the display element.

(12)

Another embodiment of the present invention is the above operation method of the semiconductor device (11), which includes an initialization period; the semiconductor device includes a first capacitor to a third capacitor; the image data retention portion includes a second transistor; the correction data retention portion includes a third transistor; a threshold voltage correction circuit includes a fourth transistor; a first terminal of the second transistor is electrically connected to a first terminal of the first capacitor; a first terminal of the third transistor is electrically connected to the gate of the first transistor, a second terminal of the first capacitor, and a first terminal of the second capacitor; the first terminal of the first transistor is electrically connected to a second terminal of the second capacitor, a first terminal of the third capacitor, and an input terminal of the display element; the back gate of the first transistor is electrically connected to a first terminal of the fourth transistor and a second terminal of the third capacitor; the initialization period includes a period in which the third transistor is turned on and a first initialization potential is applied to the gate of the first transistor, the second terminal of the first capacitor, and the first terminal of the second capacitor, a period in which the fourth transistor is turned on and a second initialization potential is applied to the back gate of the first transistor and the second terminal of the third capacitor, and a period in which a third initialization potential is applied to the first terminal of the first transistor, the second terminal of the second capacitor, and the first terminal of the third capacitor; the threshold voltage correction period includes a period in which a current from the first terminal of the first transistor to the display element is blocked, a period in which the third transistor is turned off and a potential difference between the first initialization potential and the third initialization potential is retained by the second capacitor, a period in which a high potential is applied to the second terminal of the first transistor, whereby a second current flows between the first terminal and the second terminal of the first transistor until a potential of the first terminal of the first transistor reaches a second potential at which the first transistor is turned off, and a period in which the fourth transistor is turned off and a potential difference between the second potential and the second initialization potential is retained by the third capacitor; the correction data writing period includes a period in which the third transistor is turned on and a third potential corresponding to the correction data is applied to the gate of the first transistor, the second terminal of the first capacitor, and the first terminal of the second capacitor, and a period in which the third transistor is turned off and the third potential is retained by the gate of the first transistor, the second terminal of the first capacitor, and the first terminal of the second capacitor; and the image data writing period includes a period in which the second transistor is turned on and a fourth potential corresponding to the first image data is applied to the first terminal of the first capacitor, and a period in which the third potential retained by the gate of the first transistor, the second terminal of the first capacitor, and the first terminal of the second capacitor is changed to the first potential corresponding to the second image data when the fourth potential is written to the first terminal of the first capacitor.

(13)

Another embodiment of the present invention is the above operation method of a display device (12), in which each of the first to fourth transistors includes one of a metal oxide and silicon in a channel formation region.

(14)

Another embodiment of the present invention is the above operation method of the semiconductor device (12) or (13), in which the driver circuit portion includes a fifth transistor, the first terminal of the third transistor and the input terminal of the display element are electrically connected through a first terminal and a second terminal of the fifth transistor, the initialization period, the correction data writing period, and the image data writing period include a period in which the fifth transistor is turned off, and the image display period includes a period in which the fifth transistor is turned on.

(15)

Another embodiment of the present invention is the above operation method of the semiconductor device (14), in which the fifth transistor includes one of a metal oxide and silicon in a channel formation region.

(16)

Another embodiment of the present invention is any one of the above operation methods of the semiconductor device (12) to (15), in which the semiconductor device includes a sixth transistor, a first terminal of the sixth transistor is electrically connected to the gate of the first transistor, a second terminal of the sixth transistor is electrically connected to the first terminal of the first transistor, and the threshold voltage correction period includes a period in which the sixth transistor is turned on.

(17)

Another embodiment of the present invention is the above operation method of the semiconductor device (16), in which the sixth transistor includes one of a metal oxide and silicon in a channel formation region.

(18)

Another embodiment of the present invention is an operation method of a display device including any one of the above operation methods of the semiconductor device (11) to (17), in which the display device includes a display portion including a plurality of semiconductor devices arranged in a matrix, part of the plurality of semiconductor devices functions as a first pixel and a second pixel, the first pixel and the second pixel are positioned in different rows in the display portion, and the second pixel performs an operation in each of the correction data writing period and the image data writing period when the first pixel performs an operation in the threshold voltage correction period.

Effect of the Invention

One embodiment of the present invention can provide a semiconductor device that is capable of reducing variations in the characteristics of driving transistors and correcting image data. Another embodiment of the present invention can provide a display device including the semiconductor device. Another embodiment of the present invention can provide an electronic device including the display device. Another embodiment of the present invention can provide a method for operating the semiconductor device, the display device, and the electronic device.

Another embodiment of the present invention can provide a display device including a source driver circuit with a small circuit area. Another embodiment of the present invention can provide a display device including a source driver circuit with low power consumption.

Note that the effects of one embodiment of the present invention are not limited to the effects listed above. The effects listed above do not preclude the existence of other effects. The other effects are effects that are not described in this section and will be described below. The other effects that are not described in this section will be derived from the description of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIGS. 14A1-14C2 Cross-sectional views each showing a structure example of a transistor.

FIGS. 15A1-15C2 Cross-sectional views each showing a structure example of a transistor.

MODE FOR CARRYING OUT THE INVENTION

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, in the case where a metal oxide can form a channel formation region of a transistor that has at least one of an amplifying function, a rectifying function, and a switching function, the metal oxide can be referred to as a metal oxide semiconductor or shortly as an OS. In addition, in the case where an OS FET or OS transistor is stated, it can also be called a transistor including a metal oxide or an oxide semiconductor.

In this specification and the like, metal oxides containing nitrogen are also collectively referred to as a metal oxide in some cases. A metal oxide containing nitrogen may be referred to as a metal oxynitride.

(Embodiment 1)

In this embodiment, a semiconductor device of one embodiment of the present invention and a display device including the semiconductor device will be described.

<Structure of Display Device>

Figure 1:
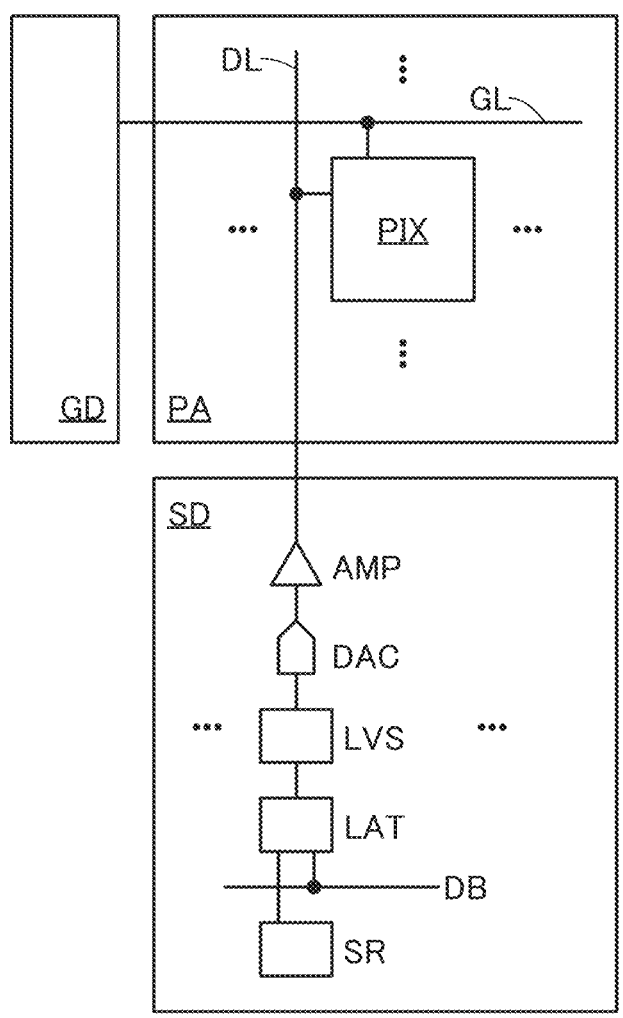
FIG. 1 A block diagram showing an example of a display device.

First, a structure example of a display device is described. FIG. 1 is a block diagram showing an example of a display device including a light-emitting element such as an inorganic EL element or an organic EL element. A display device DD includes a display portion PA, and a source driver circuit SD and a gate driver circuit GD which are peripheral circuits of the display portion PA.

The display portion PA includes a plurality of pixels PIX. Note that in FIG. 1, only one of the plurality of pixels PIX in the display portion PA is illustrated and the other pixels PIX are omitted. The plurality of pixels PIX included in the display portion PA are preferably arranged in a matrix.

In FIG. 1, the pixel PIX is electrically connected to the source driver circuit SD through a wiring DL. In addition, the pixel PIX is electrically connected to the gate driver circuit GD through a wiring GL. Since the display portion PA includes the plurality of pixels PIX, more than one pixel PIX may be electrically connected to the wiring DL. Similarly, more than one pixel PIX may be electrically connected to the wiring GL. Furthermore, more than one wiring DL and more than one wiring GL may be provided in accordance with the number of the pixels PIX included in the display portion PA. Depending on the circuit configuration of the pixel PIX, more than one wiring DL or more than one wiring GL may be electrically connected to one pixel PIX.

The pixel PIX can include one or more subpixels. The pixel PIX can include, for example, one subpixel (any one of red (R), green (G), blue (B), white (W), and the like), three subpixels (e.g., red (R), green (G), and blue (B)), or four subpixels (e.g., red (R), green (G), blue (B), and white (W), or red (R), green (G), blue (B), and yellow (Y)). Note that color elements used for the subpixels are not limited to the above, and may be combined with cyan (C) or magenta (M) as necessary.

The source driver circuit SD has a function of generating image data to be input to the pixel PIX in the display portion PA and a function of transmitting the image data to the pixel PIX.

The source driver circuit SD can include, for example, a shift register SR, a latch circuit LAT, a level shifter circuit LVS, a digital-analog converter circuit DAC, an amplifier circuit AMP, and a data bus wiring DB. In FIG. 1, an output terminal of the shift register SR is electrically connected to a clock input terminal of the latch circuit LAT; an input terminal of the latch circuit LAT is electrically connected to the data bus wiring DB; an output terminal of the latch circuit LAT is electrically connected to an input terminal of the level shifter circuit LVS; an output terminal of the level shifter circuit LVS is electrically connected to an input terminal of the digital-analog converter circuit DAC; an output terminal of the digital-analog converter circuit DAC is electrically connected to an input terminal of the amplifier circuit AMP; and an output terminal of the amplifier circuit AMP is electrically connected to the display portion PA.

Note that the latch circuit LAT, the level shifter circuit LVS, the digital-analog converter circuit DAC, and the amplifier circuit AMP that are illustrated in FIG. 1 are provided for one wiring DL. That is, the numbers of the latch circuits LAT, the level shifter circuits LVS, the digital-analog converter circuits DAC, and the amplifier circuits AMP each need to be more than one, depending on the number of the wirings SL. In this case, the shift register SR is configured to sequentially transmit pulse signals to the clock input terminals of the plurality of latch circuits LAT.

The data bus wiring DB is a wiring for transmitting a digital signal containing image data to be input to the display portion PA. The image data has gray levels; as the number of gray levels increases, variations in color or brightness can be expressed with a more smooth gradation and a more natural image can be displayed on the display portion PA. Note that an increase in the number of gray levels increases the volume of the image data and requires a digital-analog converter circuit with high resolving power.

A digital signal containing image data is input from the data bus wiring DB to the input terminal of the latch circuit LAT. Then, in response to a signal transmitted from the shift register SR, the latch circuit LAT retains the image data or outputs the retained image data from the output terminal.

The level shifter circuit LVS has a function of converting an input signal into an output signal with a higher amplitude voltage or a lower amplitude voltage. In FIG. 1, the level shifter circuit LVS has a function of converting the amplitude voltage of a digital signal containing image data that is transmitted from the latch circuit LAT into an amplitude voltage at which the digital-analog converter circuit DAC properly operates.

The digital-analog converter circuit DAC has a function of converting an input digital signal containing image data into an analog signal and a function of outputting the analog signal from the output terminal. In particular, in the case where multi-tone image data is displayed on the display portion PA, the digital-analog converter circuit DAC needs to have high resolving power.

The amplifier circuit AMP has a function of amplifying an analog signal input through the input terminal and outputting the analog signal from the output terminal. The amplifier circuit AMP is provided between the digital-analog converter circuit DAC and the display portion PA; thus, image data can be stably transmitted to the display portion PA. A voltage follower circuit including an operational amplifier and the like can be used as the amplifier circuit AMP. Note that in the case where a circuit including a differential input circuit is used as an amplifier circuit, the offset voltage of the differential input circuit is preferably set as close to 0 V as possible.

Through the above operations, the source driver circuit SD can convert the digital signal containing image data that has been transmitted from the data bus wiring DB into an analog signal and transmit the analog signal to the display portion PA.

The gate driver circuit GD has a function of selecting a pixel PIX to which image data is input among the plurality of pixels PIX included in the display portion PA.

Image data can be input to the display portion PA in the following manner, for example: the gate driver circuit GD transmits a selection signal to the plurality of pixels PIX electrically connected to one wiring GL so that image data write switching elements included in the plurality of pixels PIX are turned on, and then, transmits image data from the source driver circuit SD to the plurality of pixels PIX through the wirings DL.

One embodiment of the present invention is not limited to the structure of the display device DD shown in FIG. 1. One embodiment of the present invention can be obtained by appropriately varying a component of the display device DD according to the conditions such as the design specifications and the purpose, for example.

Configuration Example 1 of Pixel

Next, a configuration example of the pixel PIX will be described. A pixel PIX in the block diagram of FIG. 2(A) can be used as the pixel PIX, for example. Note that FIG. 2(A) also illustrates the gate driver circuit GD, the source driver circuit SD, the display portion PA, the wiring DL, and the wiring GL in order to show the electrical relation with the pixel PIX.

Figure 2A:
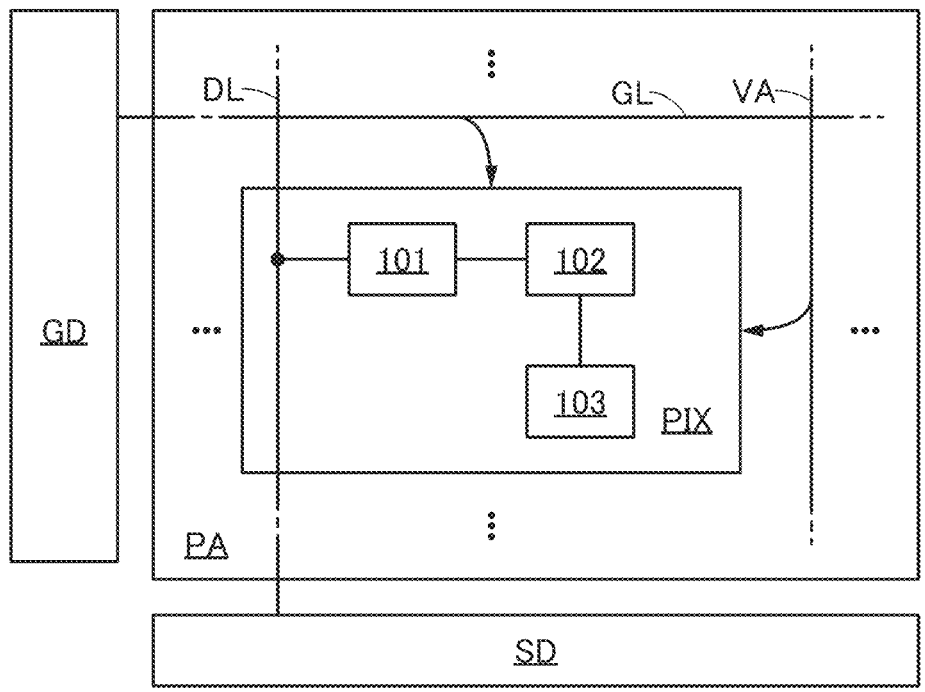
FIGS. 2A-2B Block diagrams showing configuration examples of a pixel.

The pixel PIX shown in FIG. 2(A) includes an image data retention portion 101, a driver circuit portion 102, and a display element 103.

The image data retention portion 101 is electrically connected to the driver circuit portion 102, and the driver circuit portion 102 is electrically connected to the display element 103.

The image data retention portion 101 has a function of retaining image data transmitted from the source driver circuit SD through the wiring DL. The image data retention portion 101 can include a write switching element, a capacitor, and the like, which are used to retain the image data.

The display element 103 has a function of controlling light emitted from the pixel PIX. The intensity of the light (also referred to as the luminance, the gray level, and the like) is determined depending on the image data retained in the image data retention portion 101.

As the display element 103, for example, a light-emitting element such as an inorganic EL element or an organic EL element, a transmissive liquid crystal element, or a reflective liquid crystal element can be used.

The driver circuit portion 102 has a function of driving the display element 103 in accordance with image data retained in the image data retention portion 101. For example, in the case where an organic EL element, which is an element whose emission luminance is determined by a current, is used as the display element 103, the driver circuit portion 102 can include a driving transistor for controlling the current. Note that the driving transistor has a function of supplying a drive current to the display element 103.

A wiring VA is electrically connected to the pixel PIX. The wiring VA can be, for example, a capacitor line that enables image data to be retained in the image data retention portion 101, or a voltage supply line that drives the driver circuit portion 102. Hence, the wiring VA can be one or more wirings. Note that the structure of the wiring VA is not limited to the above, and can be changed as appropriate depending on the structure of the pixel PIX. For example, in the case where the display element 103 is a light-emitting element such as an organic EL element, the wiring VA can be a current supply line for driving the light-emitting element. For example, in the case where the display element 103 is a liquid crystal element, unlike in the case of a light-emitting element, the wiring VA does not need to be a current supply line.

In the description of the display device DD in FIG. 1, the wiring GL has a function of transmitting a selection signal before image data is written to the pixel PIX; in the display device DD including the pixel PIX shown in FIG. 2(A), the wiring GL may have a function of transmitting a signal for switching a conduction state and a non conduction state between the pixel PIX in FIG. 2(A) and the wiring VA. Hence, the wiring GL can be a plurality of wirings for transmitting a plurality of signals. This allows a voltage and/or a current supplied from the wiring VA to be temporarily stopped.

Configuration Example 2 of Pixel

The pixel PIX may have a function of correcting image data. The configuration of the pixel PIX in that case is shown the block diagram of FIG. 2(B). The pixel PIX shown in FIG. 2(B) has a configuration in which a correction data retention portion 104 is added to the pixel PIX in FIG. 2(A).

The correction data retention portion 104 is electrically connected to the image data retention portion 101 and the driver circuit portion 102.

The correction data retention portion 104 has a function of retaining correction data that is transmitted from a circuit WSD through a wiring WDL, and a function of correcting image data retained in the image data retention portion 101 on the basis of the correction data.

In that case, the driver circuit portion 102 has a function of driving the display element 103 in response to the image data that has been corrected in the correction data retention portion 104.

The correction data retention portion 104 can include a write switching element, a capacitor, and the like for retaining correction data.

A method using a capacitor is an example of the correction method of image data. Specifically, a first potential corresponding to correction data is retained in one of a pair of terminals of a capacitor in the correction data retention portion 104; then, the one terminal of the capacitor is brought into an electrically floating state and a second potential corresponding to image data is retained in the other of the pair of terminals of the capacitor in the image data retention portion 101. Accordingly, the first potential of the one terminal of the capacitor is raised in accordance with the second potential by capacitive coupling, and assumed to become a third potential. This third potential corresponds to corrected image data. The third potential is then applied to the driver circuit portion 102, so that the driver circuit portion 102 can drive the display element 103 in accordance with the third potential.

Figure 2B:
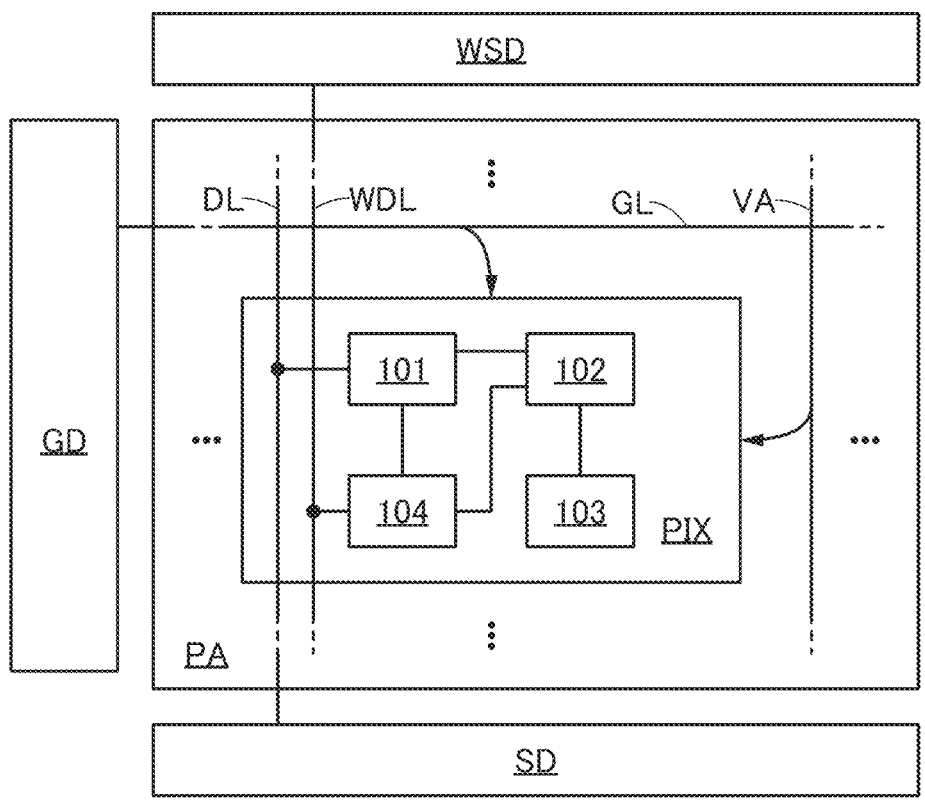

The circuit WSD has a function of generating correction data for correcting an image to be displayed in the pixel PIX included in the display portion PA, and a function of transmitting the correction data to the pixel PIX. Note that although FIG. 2(B) illustrates both the circuit WSD and the source driver circuit SD, for example, the source driver circuit SD may have the aforementioned functions of the circuit WSD. Specifically, a demultiplexer or the like may be provided inside or at an output terminal of the source driver circuit SD so that one circuit can transmit the image data and the correction data to each of the wiring DL and the wiring WDL.

When the pixel PIX shown in FIG. 2(B) is used in the display device DD, image correction can be performed on the image data retained in the image data retention portion 101 in accordance with the correction data retained in the correction data retention portion 104. Examples of the image correction here include amplification of luminance and conversion to a multi-tone image.

Figure 3:
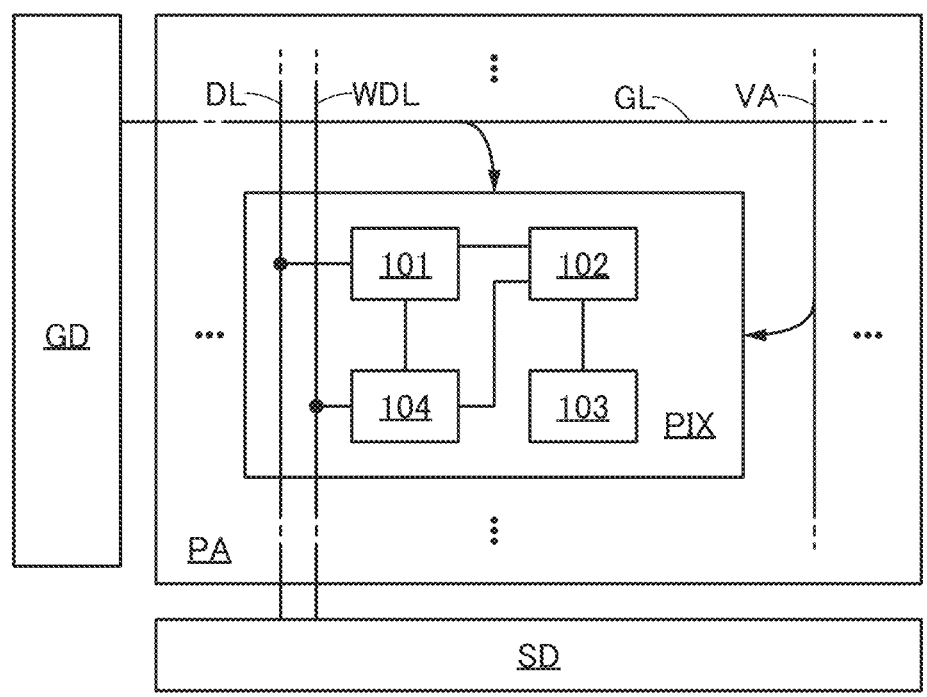
FIG. 3 A block diagram showing a configuration example of a pixel.

Note that in the case where the source driver circuit SD can generate the correction data transmitted from the circuit WSD to the pixel PIX in FIG. 2(B), the wiring WDL may be electrically connected to the source driver circuit SD without providing the circuit WSD. Such a configuration is shown in FIG. 3. The pixel PIX and its peripheral circuits shown in FIG. 3 have a configuration in which image data is generated in the source driver circuit SD and transmitted to the image data retention portion 101 through the wiring DL and correction data is generated in the source driver circuit SD and transmitted to the correction data retention portion 104 through the wiring WDL. When the circuit configuration shown in FIG. 3 is used for the display device DD, the circuit area of the display device DD can be reduced.

Circuit Configuration Example 1 of Pixel

Figure 4:
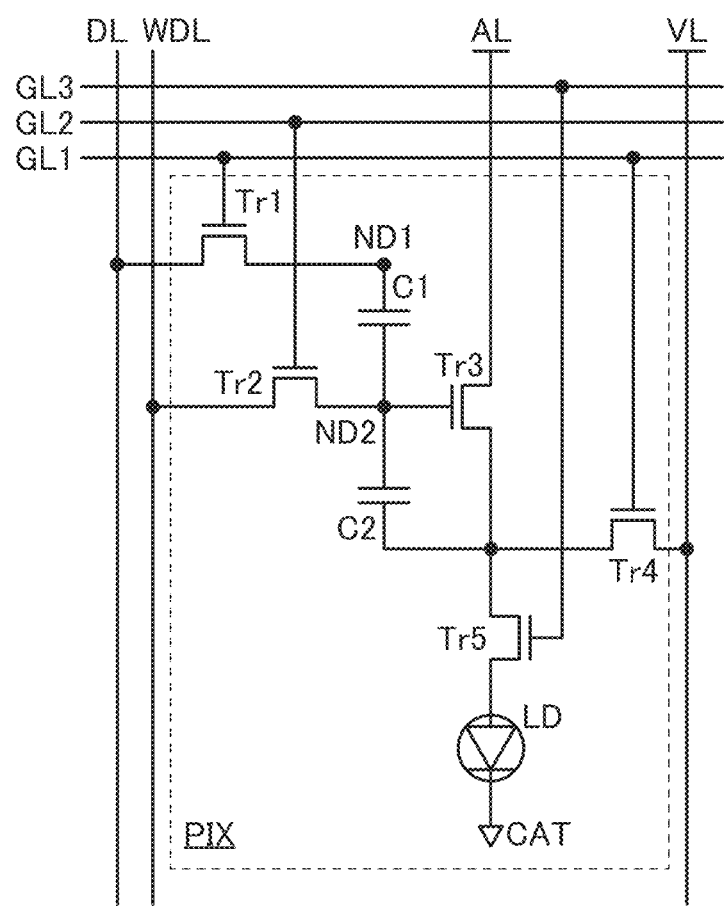
FIG. 4 A circuit diagram showing a configuration example of a pixel.

Next, a specific circuit configuration of the pixel PIX shown in FIG. 2(B) is described. FIG. 4 illustrates a circuit configuration example of the pixel PIX shown in FIG. 2(B).

The pixel PIX shown in FIG. 4 includes a transistor Tr1 to a transistor Tr5, a capacitor C1, a capacitor C2, and a light-emitting element LD. In addition, the wiring DL, the wiring WDL, a wiring GL1 to a wiring GL3, a wiring VL, a wiring AL, and a wiring CAT are electrically connected to the pixel PIX.

The transistor Tr1, the transistor Tr2, the transistor Tr4, and the transistor Tr5 each function as a switching element. The transistor Tr3 functions as a driving transistor for controlling current flowing through the light-emitting element LD. The structure of a transistor described later in Embodiment 3 can be used for the transistor Tr1 to the transistor Tr5.

The wiring DL is a wiring for transmitting image data to the pixel PIX and can be a wiring corresponding to the wiring DL shown in FIG. 2(B). The wiring WDL is a wiring for transmitting correction data with respect to the image data and can be a wiring corresponding to the wiring WDL shown in FIG. 2(B). In addition, the wiring GL1 to the wiring GL3 are each a selection signal line for the pixel PIX and can be a wiring corresponding to the wiring GL shown in FIG. 2(B).

The wiring VL is a wiring for supplying a predetermined potential to a specific node in the pixel PIX. In addition, the wiring AL is a wiring for supplying current flowing to the light-emitting element LD. The wiring VL and the wiring AL can each be a wiring corresponding to the wiring VA shown in FIG. 2(B).

The wiring CAT is a wiring for supplying a predetermined potential to an output terminal of the light-emitting element LD. The predetermined potential can be, for example, a reference potential, a low-level potential, or a potential lower than these potentials. The wiring CAT can be a wiring corresponding to the wiring VA shown in FIG. 2(B). The wiring CAT preferably functions as a wiring that supplies a common potential in the plurality of pixels PIX included in the display portion PA.

A first terminal of the transistor Tr1 is electrically connected to a first terminal of the capacitor C1, a second terminal of the transistor Tr1 is electrically connected to the wiring DL, and a gate of the transistor Tr1 is electrically connected to the wiring GL1. A first terminal of the transistor Tr2 is electrically connected to a gate of the transistor Tr3, a second terminal of the capacitor C1, and a first terminal of the capacitor C2, a second terminal of the transistor Tr2 is electrically connected to the wiring WDL, and a gate of the transistor Tr2 is electrically connected to the wiring GL2.

Note that in this embodiment, an electrical connection point of the first terminal of the transistor Tr1 and the first terminal of the capacitor C1 is referred to as a node ND1, and an electrical connection point of the first terminal of the transistor Tr2, the gate of the transistor Tr3, the second terminal of the capacitor C1, and the first terminal of the capacitor C2 is referred to as a node ND2.

A first terminal of the transistor Tr3 is electrically connected to the wiring AL, and a second terminal of the transistor Tr3 is electrically connected to a first terminal of the transistor Tr4, a first terminal of the transistor Tr5, and a second terminal of the capacitor C2. A second terminal of the transistor Tr4 is electrically connected to the wiring VL, and a gate of the transistor Tr4 is electrically connected to the wiring GL1. A second terminal of the transistor Tr5 is electrically connected to an input terminal of the light-emitting element LD, and a gate of the transistor Tr5 is electrically connected to the wiring GL3. The output terminal of the light-emitting element LD is electrically connected to the wiring CAT.

The second terminal of the transistor Tr3 and the light-emitting element LD are electrically connected to each other through the first terminal and the second terminal of the transistor Tr5; thus, the transistor Tr5 functions as a switching element that allows switching a conduction state and a non conduction state between the second terminal of the transistor Tr3 and the input terminal of the light-emitting element LD.

The capacitor C1 has a function of retaining a potential difference between the node ND1 and the node ND2, and the capacitor C2 has a function of retaining a potential difference between the second terminal and the gate of the transistor Tr3.

In the pixel PIX in FIG. 4, at least one of the transistor Tr1 to the transistor Tr5 is preferably an OS transistor. In particular, the OS transistor preferably includes an oxide containing at least one of indium, an element M (the element M is aluminum, gallium, yttrium, or tin), and zinc in its channel formation region. The oxide will be described in detail in Embodiment 4. The use of such an OS transistor as at least one of the transistor Tr1 to the transistor Tr5 enables the off-state current of the transistor to be extremely low. When data is retained at the first terminal of the capacitor C1 (the node ND1), the use of an OS transistor as the transistor Tr1 can prevent data retained at the node ND1 from being corrupted by the off-state current. Similarly, when data is retained at the gate of the transistor Tr3, the second terminal of the capacitor C1, and the first terminal of the capacitor C2 (the node ND2), the use of an OS transistor as the transistor Tr2 can prevent data retained at the node ND2 from being corrupted by the off-state current. When light emission of the light-emitting element LD is temporarily stopped, the use of an OS transistor as the transistor Tr5 can prevent light emission of the light-emitting element LD due to the off-state current. The use of OS transistors as all of the transistor Tr1 to the transistor Tr5 enables the transistors to be formed at a time, resulting in a reduction in the number of manufacturing steps of the display portion PA in some cases. Thus, the time needed to manufacture the display portion PA can be shortened, and the number of the display portions PA that are manufactured in a certain period can be increased.

For at least one of the transistor Tr1 to the transistor Tr5, a transistor including silicon in a channel formation region (hereinafter referred to as a Si transistor) can be used, for example. As silicon, hydrogenated amorphous silicon, microcrystalline silicon, polycrystalline silicon, single crystal silicon, or the like can be used, for example. Some of the transistor Tr1 to the transistor Tr5 can be Si transistors and the others can be OS transistors.

The image data retention portion 101 shown in FIG. 2(B) can include, for example, the transistor Tr1 shown in FIG. 4. The driver circuit portion 102 can include, for example, the transistor Tr3 to the transistor Tr5 shown in FIG. 4. The display element 103 can include, for example, the light-emitting element LD shown in FIG. 4. The correction data retention portion 104 can include, for example, the transistor Tr2 shown in FIG. 4. Note that the image data retention portion 101, the driver circuit portion 102, and the correction data retention portion 104 each have a function of retaining the potentials of the capacitor C1 and the capacitor C2 shown in FIG. 4; it is therefore not possible to uniquely determine which circuit includes each of the capacitor C1 and the capacitor C2. In other words, each of the capacitor C1 and the capacitor C2 is included in any one of the image data retention portion 101, the driver circuit portion 102, and the correction data retention portion 104.

In FIG. 2, the display quality of the display device DD is sometimes influenced by variations in the characteristics of the driving transistor included in the driver circuit portion 102. In particular, in the case where the light-emitting element LD is used as the display element 103, the influence is not ignorable; thus, the correction of the threshold voltage of the transistor Tr3 functioning as the driving transistor is required to increase the display quality of the display device DD. In the case where the threshold voltage is corrected by an external circuit of the display portion PA, the external circuit needs to acquire a current flowing between the first terminal and the second terminal of the driving transistor and to perform an arithmetic operation on image data with the current successively, which may increase the time taken to correct the threshold voltage and lead to higher power consumption.

Configuration Example 3 of Pixel

In view of the above, one embodiment of the present invention is configured to include a threshold voltage correction circuit portion, which corrects the threshold voltage of the driving transistor included in the driver circuit portion 102, in the pixel PIX including the image data retention portion 101 and the correction data retention portion 104.

This eliminates the need for the external circuit of the display portion PA to perform an arithmetic operation of image data based on the threshold voltage of the driving transistor, so that the external circuit can be omitted in the display device DD. In addition, the threshold voltage correction circuit portion is configured to correct the threshold voltage by application of a predetermined potential to a back gate of the driving transistor, thereby omitting the arithmetic operation on image data for correcting the threshold voltage of the driving transistor.

Figure 5A:
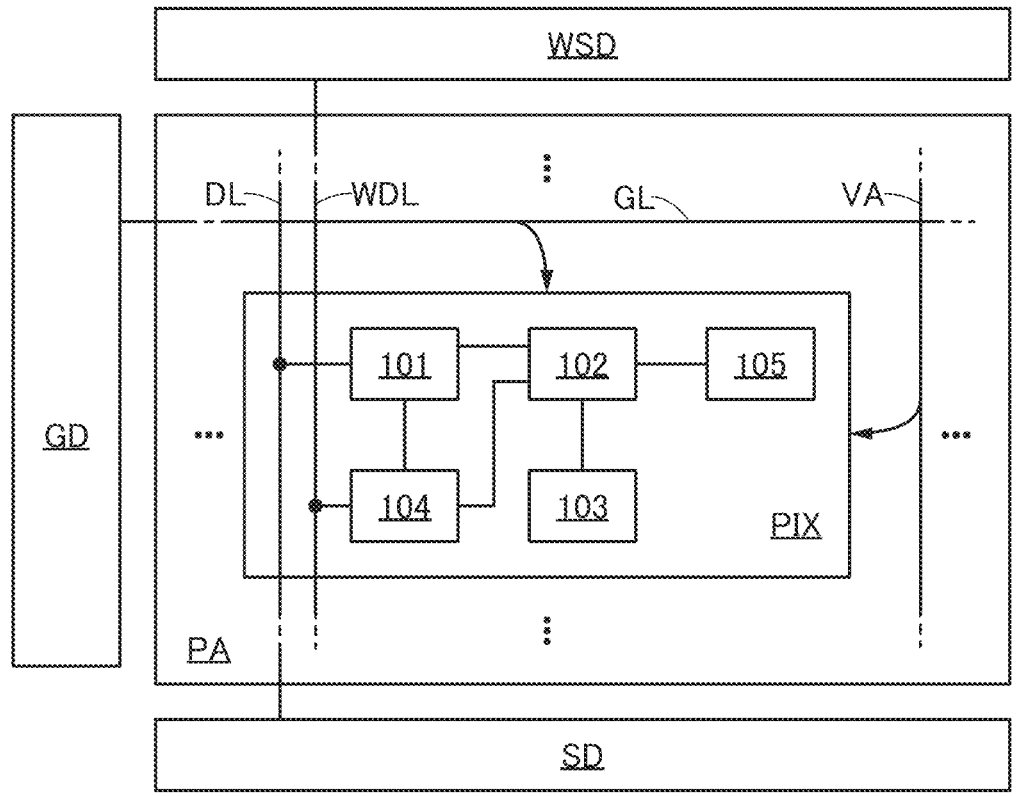
FIGS. 5A-5B Block diagrams showing configuration examples of a pixel.

FIG. 5(A) is a block diagram illustrating a circuit configuration example of the pixel PIX, which is the semiconductor device of one embodiment of the present invention.

The pixel PIX shown in FIG. 5(A) includes the image data retention portion 101, the driver circuit portion 102, the display element 103, the correction data retention portion 104, and a threshold voltage correction circuit portion 105. The pixel PIX shown in FIG. 5(A) has a configuration in which the threshold voltage correction circuit portion 105 is added to the pixel PIX in FIG. 2(B).

The threshold voltage correction circuit portion 105 is electrically connected to the driver circuit portion 102.

The threshold voltage correction circuit portion 105 has a function of correcting the threshold voltage of the driving transistor included in the driver circuit portion 102. The threshold voltage correction circuit portion 105 can include a switching element, a capacitor, or the like for retaining the correction content of the threshold voltage.

The threshold voltage correction circuit portion 105 is electrically connected to the wiring GL, the wiring VA, or the like and thus can operate with a selection signal transmitted from the wiring GL, or a voltage and/or a current transmitted from the wiring VA.

When the pixel PIX shown in FIG. 5(A) is used in the display device DD, the correction of the threshold voltage of the driving transistor included in the driver circuit portion 102 can be performed with the threshold voltage correction circuit portion 105 in addition to the correction of the image data with the image data retention portion 101 and the correction data retention portion 104.

The display device DD using the pixel PIX shown in FIG. 5(A) is suitable for, for example, a display device including a light-emitting element such as an organic EL element as a display element. Since the luminance of a light-emitting element such as an organic EL element is determined by the amount of current flowing in the light-emitting element, variations in the characteristics of the driving transistor passing the current causes a decrease in the display quality of the display device. The use of the pixel PIX shown in FIG. 5(A) in the display device enables the threshold voltage of the driving transistor to be corrected; hence, the current flowing in the driving transistor is prevented from changing with variations in the transistor characteristics, and a decrease in the display quality of the display device can be prevented. Furthermore, when the image data is corrected with the correction data retention portion 104 included in the pixel PIX shown in FIG. 5(A), the display quality of the display device can be improved. In particular, in the case of a large-sized display device, which tends to have large variations in the characteristics of the driving transistor, the influence of the characteristics variations can be reduced with the use of the pixel PIX shown in FIG. 5(A). In addition, the threshold voltage is corrected in the pixel PIX, which eliminates the need for the external circuit that corrects the threshold voltage, reducing the costs.

Figure 5B:
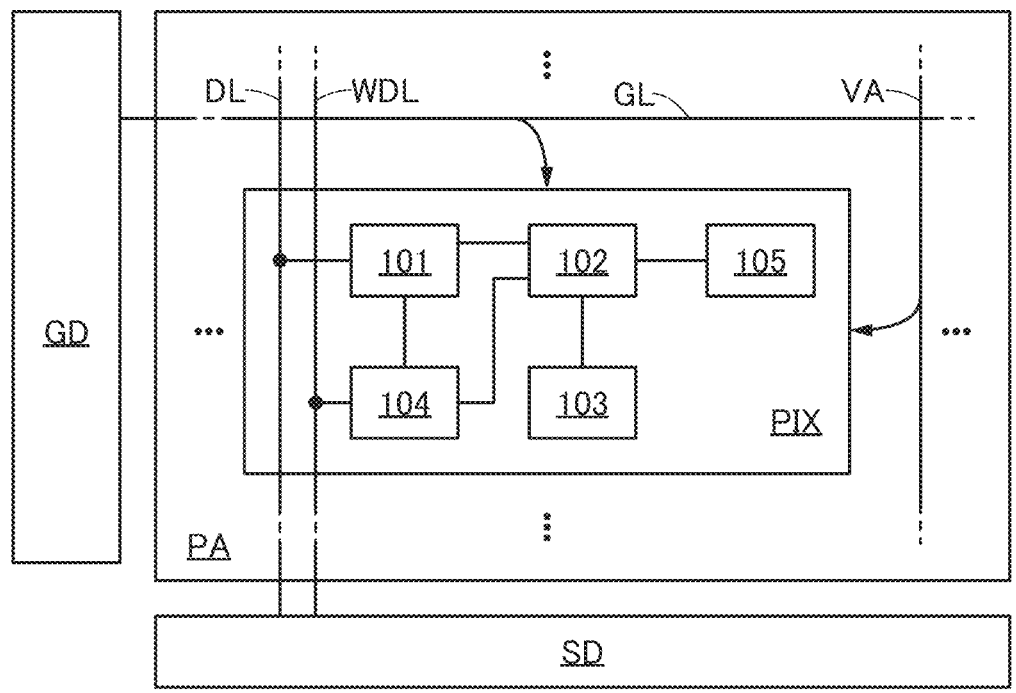

The pixel PIX and the peripheral circuits shown in FIG. 5(A) may have a configuration, as in FIG. 3, in which the circuit WSD is omitted and correction data is generated in the source driver circuit SD and transmitted to the correction data retention portion 104 through the wiring WDL. Such a configuration is shown in FIG. 5(B). When the circuit configuration shown in FIG. 5(B) is used for the display device DD, the circuit WSD can be omitted to reduce the circuit area of the display device DD.

Circuit Configuration Example 2 of Pixel

Figure 6A:
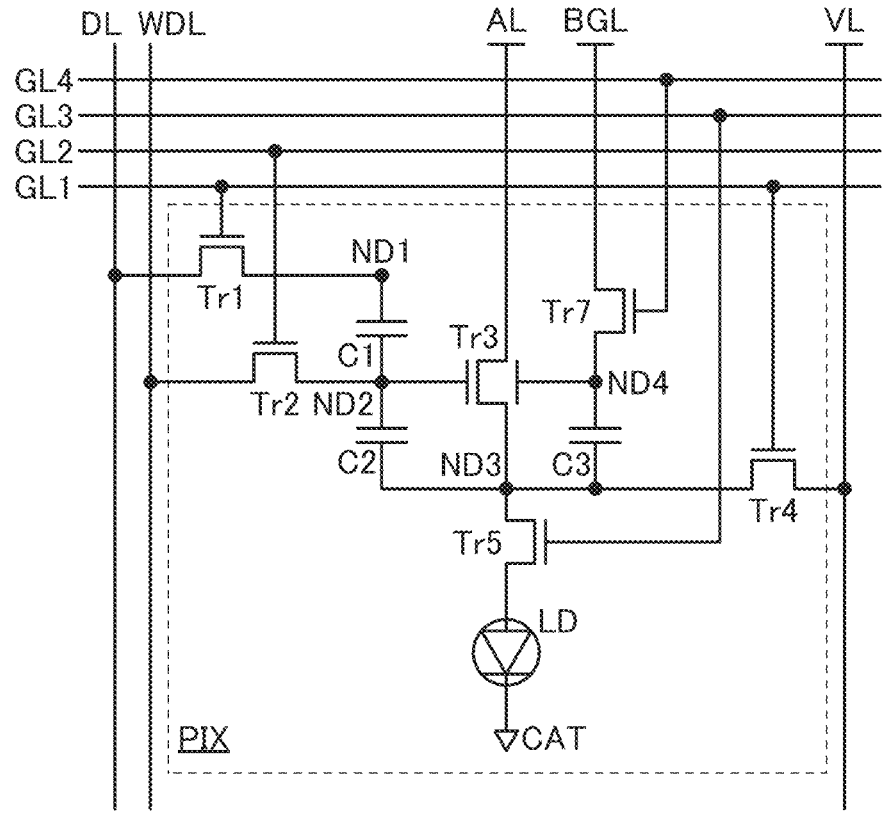
FIGS. 6A-6B Circuit diagrams showing configuration examples of a pixel.

Next, a specific circuit configuration of the pixel PIX shown in FIGS. 5(A) and 5(B) is described. FIG. 6(A) illustrates a circuit configuration example of the pixel PIX shown in FIGS. 5(A) and 5(B).

The pixel PIX shown in FIG. 6(A) has a configuration in which a transistor Tr7 and a capacitor C3 are added to the pixel PIX shown in FIG. 4. The pixel PIX shown in FIG. 6(A) is different from the pixel PIX shown in FIG. 4 in that the transistor Tr3 has a back gate.

The back gate of the transistor Tr3 is electrically connected to a first terminal of the transistor Tr7 and a first terminal of the capacitor C3. A second terminal of the transistor Tr7 is electrically connected to a wiring BGL, and a gate of the transistor Tr7 is electrically connected to a wiring GL4. A second terminal of the capacitor C3 is electrically connected to the second terminal of the transistor Tr3, the first terminal of the transistor Tr4, the first terminal of the transistor Tr5, and the second terminal of the capacitor C2.

Note that in this example, an electrical connection point of the second terminal of the transistor Tr3, the first terminal of the transistor Tr4, the first terminal of the transistor Tr5, the second terminal of the capacitor C2, and the second terminal of the capacitor C3 is referred to as a node ND3, and an electrical connection point of the back gate of the transistor Tr3, the first terminal of the transistor Tr7, and the first terminal of the capacitor C3 is referred to as a node ND4.

The wiring GL4 as well as the wiring GL1 to the wiring GL3 is a selection signal line for the pixel PIX and is a wiring corresponding to the wiring GL shown in FIGS. 5(A) and 5(B).

The wiring BGL is a wiring for supplying a predetermined potential to a specific node in the pixel PIX. The wiring BGL can be a wiring corresponding to the wiring VA shown in FIGS. 5(A) and 5(B).

The transistor Tr7 functions as a switching element. The structure of the transistor described in Embodiment 3 can be used for the transistor Tr7. Furthermore, the transistor Tr7 is preferably an OS transistor like the transistor Tr1, the transistor Tr2, and the transistor Tr5. Note that for the other description of the transistor Tr7, the description of the transistor Tr1 to the transistor Tr5 is referred to.

The threshold voltage correction circuit portion 105 shown in FIGS. 5(A) and 5(B) can include, for example, the transistor Tr7. Since the driver circuit portion 102 and the threshold voltage correction circuit portion 105 share a function of retaining the potential of the capacitor C3 shown in FIG. 6(A), which of the circuits includes the capacitor C3 cannot be determined uniquely. In other words, the capacitor C3 can be included in any one of the driver circuit portion 102 and the threshold voltage correction circuit portion 105.

Figure 6B:
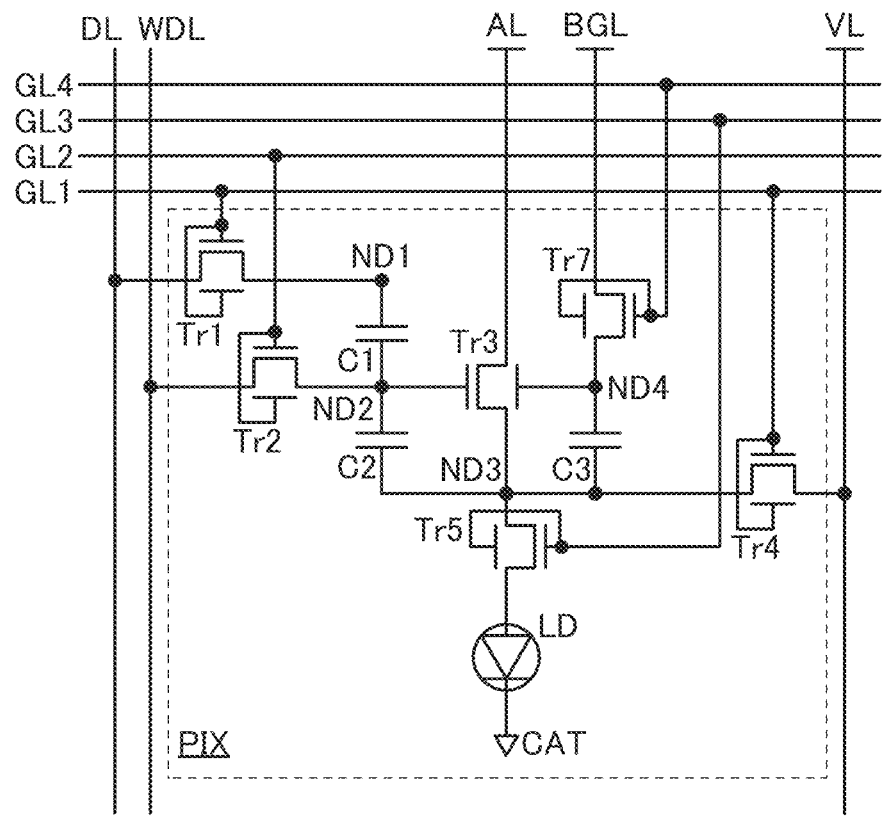

Note that the transistor Tr1, the transistor Tr2, the transistor Tr4, the transistor Tr5, and the transistor Tr7 shown in FIG. 6(A) may be a transistor having a back gate. The pixel PIX shown in FIG. 6(B) has a structure in which a back gate is added to each of the transistor Tr1, the transistor Tr2, the transistor Tr4, the transistor Tr5, and the transistor Tr7 in the pixel PIX shown in FIG. 6(A). In FIG. 6(B), the gate and the back gate of each of the transistor Tr1, the transistor Tr2, the transistor Tr4, the transistor Tr5, and the transistor Tr7 are electrically connected to each other. The transistor whose gate is electrically connected to the back gate has a high on-state current, resulting in high operation of the pixel PIX with the structure shown in FIG. 6(B). Although the gates and the back gates of all of the transistor Tr1, the transistor Tr2, the transistor Tr4, the transistor Tr5, and the transistor Tr7 are connected in FIG. 6(B), the pixel PIX may have a structure in which a potential is applied to the back gate from another wiring. Instead of the structure of the pixel PIX shown in FIG. 6(B), in which all of the transistor Tr1, the transistor Tr2, the transistor Tr4, the transistor Tr5, and the transistor Tr7 have the back gates, only some transistors may have the back gates.

Circuit Configuration Example 3 of Pixel

Figure 7A:
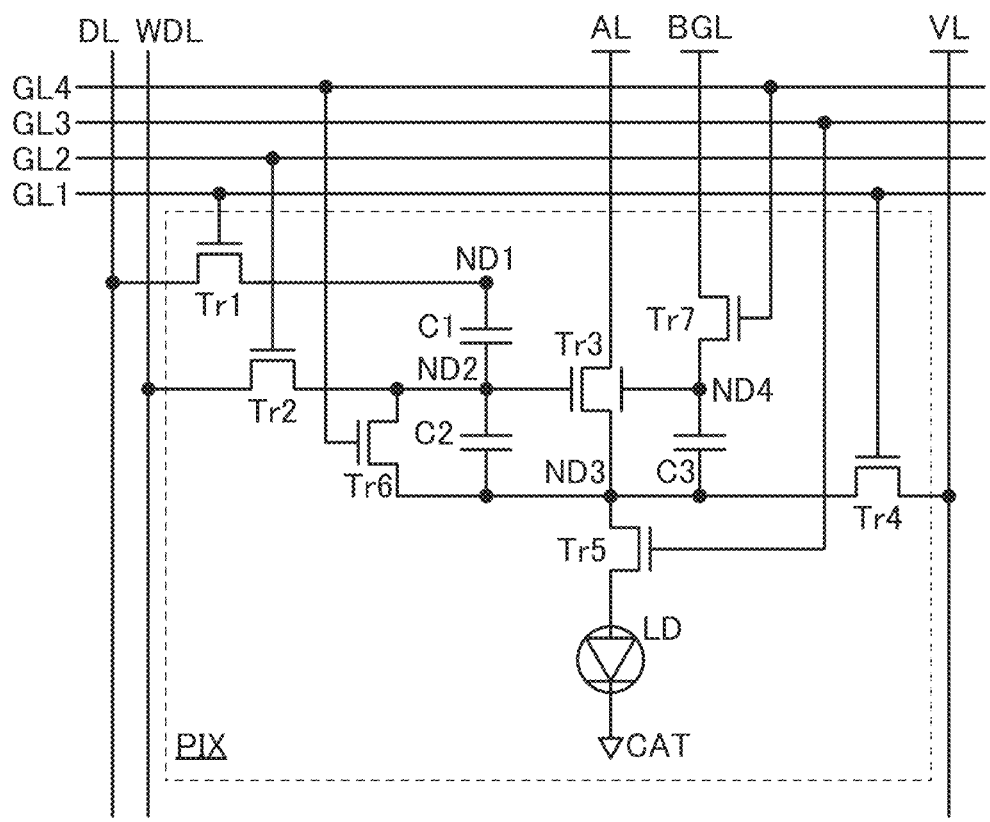
FIGS. 7A-7B Circuit diagrams showing configuration examples of a pixel.

FIG. 7(A) illustrates a circuit configuration example of the pixel PIX shown in FIGS. 5(A) and 5(B), which is different from the PIX shown in FIG. 6(A).

The pixel PIX shown in FIG. 7(A) has a configuration in which a transistor Tr6 is added to the pixel PIX shown in FIG. 6(A).

A first terminal of the transistor Tr6 is electrically connected to the second terminal of the transistor Tr2, the gate of the transistor Tr3, the second terminal of the capacitor C1, and the first terminal of the capacitor C2; a second terminal of the transistor Tr6 is electrically connected to the second terminal of the transistor Tr3, the first terminal of the transistor Tr4, the first terminal of the transistor Tr5, the second terminal of the capacitor C2, and the second terminal of the capacitor C3; and a gate of the transistor Tr6 is electrically connected to the wiring GL4.

The transistor Tr6 functions as a switching element. The structure described in Embodiment 3 can be used for the transistor Tr6. Furthermore, the transistor Tr6 is preferably an OS transistor like the transistor Tr1, the transistor Tr2, and the transistor Tr5. Note that for the other description of the transistor Tr6, the description of the transistor Tr1 to the transistor Tr5 is referred to.

In the case where the threshold voltage of the transistor Tr3, which is the driving transistor, needs to be corrected more accurately than that in the pixel PIX shown in FIG. 6(A), the transistor Tr6 is preferably provided in the pixel PIX as shown in FIG. 7(A). In terms of the operation principle of the correction of the threshold voltage, the potential of the second terminal of the transistor Tr3 (node ND3) is preferably as close to the potential of the node ND2 as possible; when the threshold voltage is corrected in the pixel PIX shown in FIG. 7(A), the potential difference between the node ND3 and the node ND2 can be closer to 0 V than that in the pixel PIX shown in FIG. 6(A).

Since the driver circuit portion 102 and the correction data retention portion 104 share the switching function of the transistor Tr6, which of the circuits includes the transistor Tr6 cannot be determined uniquely. In other words, the transistor Tr6 can be included in any one of the driver circuit portion 102 and the correction data retention portion 104.

Circuit Configuration Example 4 of Pixel

Figure 7B:
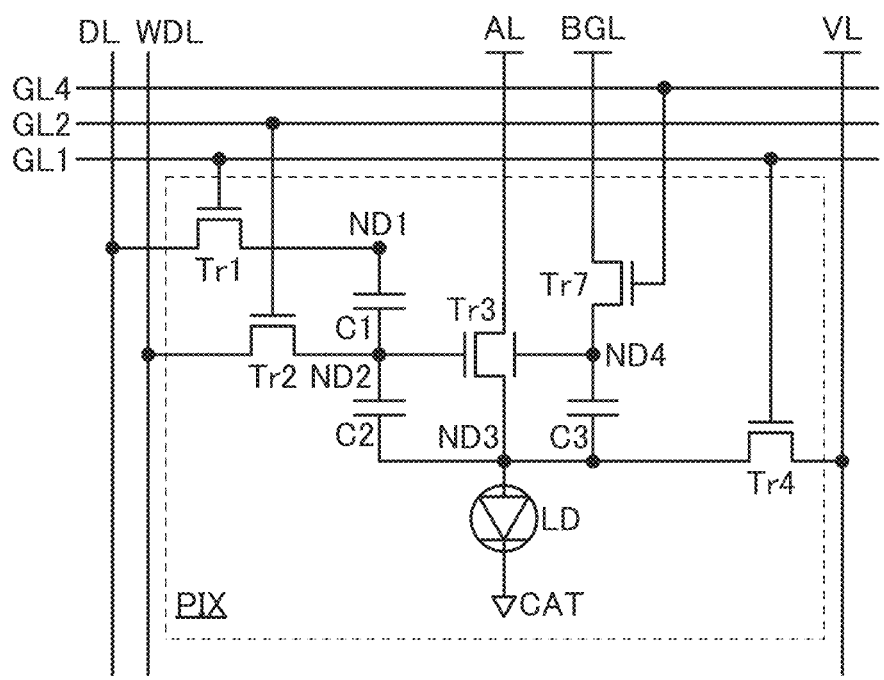

FIG. 7(B) illustrates a circuit configuration example of the pixel PIX shown in FIGS. 5(A) and 5(B), which is different from the PIX shown in each of FIGS. 6(A) and 6(B) and FIG. 7(A).

The pixel PIX shown in FIG. 7(B) has a configuration in which the transistor Tr5 is omitted from the pixel PIX shown in FIG. 6(A). The pixel PIX shown in FIG. 7(B) has a smaller number of transistors than the pixel PIX shown in FIGS. 6(A) and 6(B) and FIG. 7(A), thereby having a smaller pixel circuit area and a higher aperture ratio. In the case where the light-emitting element LD does not emit light in the pixel PIX shown in FIG. 7(B), current should stop flowing to the input terminal of the light-emitting element LD; at that time, the potential applied to the wiring AL is reduced or a potential that turns the transistor Tr3 off is applied to the gate of the transistor Tr3. In particular, in the case where the potential applied to the wiring AL is reduced, the potential of the wiring AL is preferably made lower than the potential of the wiring CAT.

<Operation Example of Pixel>

Next, an operation example of the aforementioned pixel circuit, in particular, the pixel PIX shown in FIG. 6(A), will be described.

Figure 8:
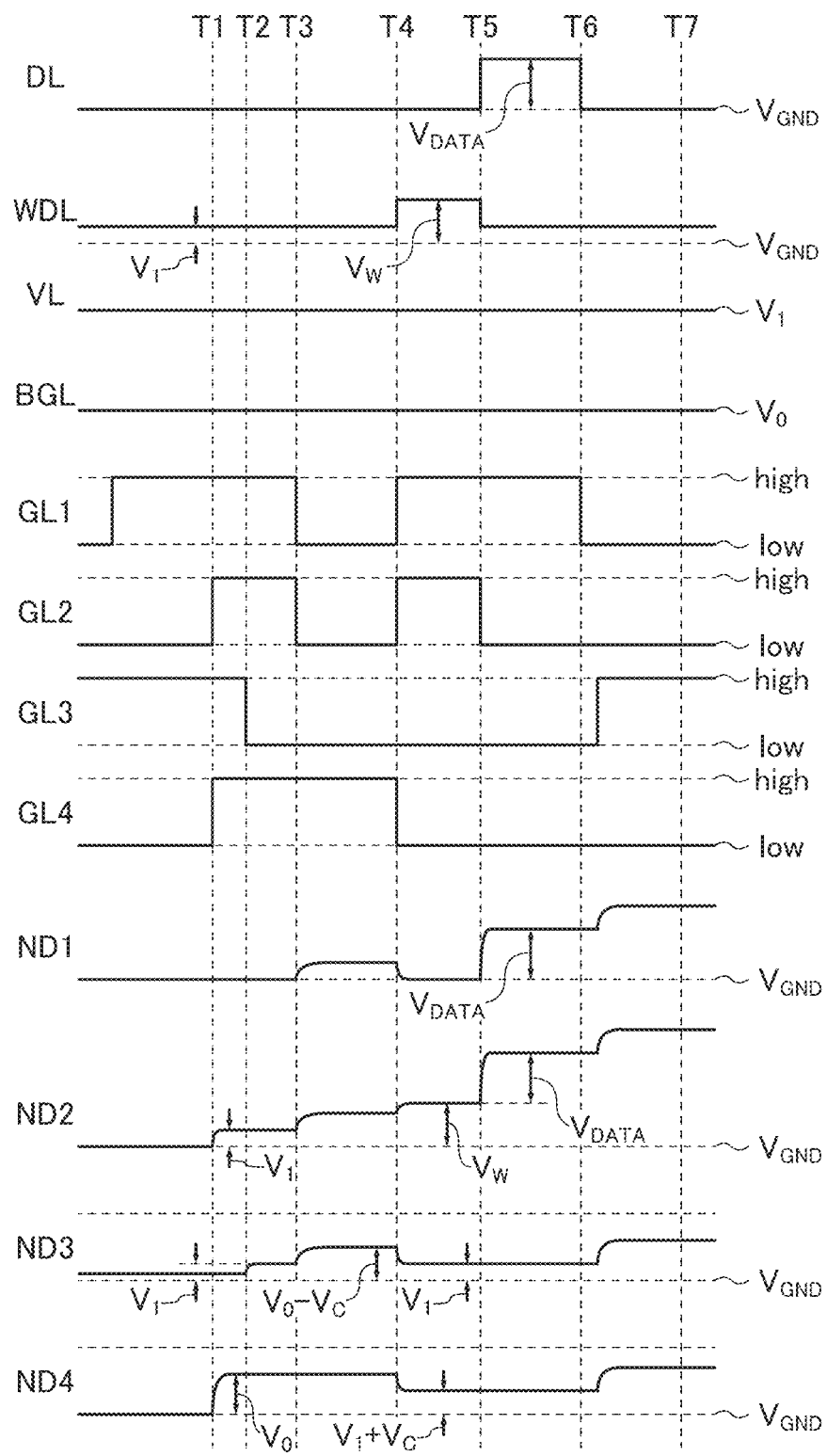
FIG. 8 A timing chart showing an operation example of a pixel.

FIG. 8 is a timing chart showing an operation example of the pixel PIX shown in FIG. 6(A). The timing chart of FIG. 8 shows changes in the potentials of the wiring DL, the wiring WDL, the wiring VL, the wiring BGL, the wiring GL1 to the wiring GL4, and the node ND1 to the node ND4 before Time T1, from Time T1 to Time T7, and after T7. Note that in FIG. 8, "high" refers to a high-level potential and "low" refers to a low-level potential. Also in FIG. 8, "$V_{GND}$" refers to a reference potential.

Note that $V_1$ and $V_0$ are assumed to be constantly applied to the wiring VL and the wiring BGL, respectively, before Time T1, from Time T1 to Time T7, and after T7. The potential $V_1$ is lower than the potential of the voltage supplied from the wiring AL, and the potential $V_0$ is higher than $V_1$.

Note that in this operation example, the transistor Tr1, the transistor Tr2, the transistor Tr4, the transistor Tr5, and the transistor Tr7 are assumed to operate in a linear region in the on state unless otherwise specified. In other words, the gate voltage, the source voltage, and the drain voltage of each of the transistor Tr1, the transistor Tr2, the transistor Tr4, the transistor Tr5, and the transistor Tr7 are assumed to be appropriately biased so that the transistors operate in the linear region.

Furthermore, in this operation example, the transistor Tr3 is assumed to operate in a saturation region unless otherwise specified. In other words, the gate voltage, the source voltage, and the drain voltage of the transistor Tr3 are assumed to be appropriately biased so that the transistor operates in the saturation region. Note that even when the operation of the transistor Tr3 deviates from an operation in an ideal saturation region, the gate voltage, the source voltage, and the drain voltage of the transistor Tr3 are regarded as being appropriately biased as long as the accuracy of output current is within a desired range.

[Just Before Time T1]

Just before Time T1, a high-level potential is applied to the wiring GL1 and the wiring GL3, and a low-level potential is applied to the wiring GL2 and the wiring GL4. When the wiring GL1 is at a high-level potential, a high-level potential is applied to the gate of each of the transistor Tr1 to the transistor Tr4; thus, the transistor Tr1 to the transistor Tr4 are turned on. That is, electrical continuity is established between the wiring DL and the node ND1, and electrical continuity is established between the wiring VL and the node ND3. When the wiring GL2 is at a low-level potential, a low-level potential is applied to the gate of the transistor Tr2; thus, the transistor Tr2 is turned off. That is, there is no electrical continuity between the wiring WDL and the node ND2. In addition, when the wiring GL3 is at a high-level potential, a high-level potential is applied to the gate of the transistor Tr5; thus, the transistor Tr5 is turned on. That is, electrical continuity is established between the input terminal of the light-emitting element LD and the first terminal of the transistor Tr5. Furthermore, when the wiring GL4 is at a low-level potential, a low-level potential is applied to the gate of the transistor Tr7; thus, the transistor Tr7 is turned off. That is, there is no electrical continuity between the wiring BGL and the node ND4.

Just before Time T1, the potential $V_{GND}$ is applied to the wiring DL and the potential $V_1$ is applied to the wiring WDL. Since the transistor Tr1 is in the on state, the potential of the node ND1 is $V_{GND}$. Furthermore, since the transistor Tr4 is in the on state, electrical continuity is established between the node ND3 and the wiring VL that supplies the potential $V_1$; at this time, the transistor Tr5 is also in the on state, so that the potential of the node ND3 is lower than $V_1$. The potential $V_1$ is applied to the wiring WDL.

When the potential difference between the node ND2 and a source of the transistor Tr3 (gate-source voltage) is greater than the threshold voltage of the transistor Tr3, the transistor Tr3 is turned on, and a current that flows between the source and a drain of the transistor Tr3 is determined in accordance with the gate-source voltage of the transistor Tr3. In the case where the second terminal of the transistor Tr3 is the source, the current flows from the wiring AL to the input terminal of the light-emitting element LD through the transistor Tr3 and the transistor Tr5. Consequently, the light-emitting element LD emits light. Note that the potential of the node ND2 is a potential that turns the transistor Tr3 off in this operation example, and in the timing chart of FIG. 8, the potential of the node ND2 is denoted as $V_{GND}$.

[From Time T1 to Time T2 (First Initialization Period)]

From Time T1 to Time T2, a high-level potential is applied to the wiring GL2 and the wiring GL4. Thus, a high-level potential is applied to the gate of each of the transistor Tr2 and the transistor Tr7, so that the transistor Tr2 and the transistor Tr7 are turned on. Consequently, the potential of the node ND2 becomes $V_1$ and the potential of the node ND4 becomes $V_0$. The potential of the node ND3 has been continuously lower than the potential $V_1$ since before Time T1 because the transistor Tr5 is on.

[From Time T2 to Time T3 (Second Initialization Period)]

From Time T2 to Time T3, a low-level potential is applied to the wiring GL3. Thus, a low-level potential is applied to the gate of the transistor Tr5, so that the transistor Tr5 is turned off. Consequently, no current flows from the node ND3 to the input terminal of the light-emitting element LD through the transistor Tr5.

The transistor Tr5 is in the off state and the transistor Tr4 is in the on state; hence, the potential of the node ND3 increases to $V_1$. The potential of the node ND3 is, to be exact, lower than $V_1$ because of the transistor Tr4 between the wiring VL and the node ND3, but is close to $V_1$. At this time, the potential of the node ND2 (the gate of the transistor Tr3) and the potential of the node ND3 (the second terminal of the transistor Tr3) are both approximately $V_1$, so that the potential between the first terminal and the second terminal of the capacitor C2 is approximately 0V.

In the case where the pixel PIX shown in FIG. 7(A) is employed, a high-level potential is applied to the wiring GL4 from Time T2 to Time T3 and thus, the transistor Tr6 is on. Consequently, electrical continuity is established between the gate and the second terminal of the transistor Tr3, so that the potential between the first terminal and the second terminal of the capacitor C2 is approximately 0 V.

[From Time T3 to Time T4 (Threshold Voltage Correction Period)]

From Time T3 to Time T4, a low-level potential is applied to the wiring GL1 and the wiring GL2. Thus, a low-level potential is applied to the gate of each of the transistor Tr1, the transistor Tr2, and the transistor Tr4, so that the transistor Tr1, the transistor Tr2, and the transistor Tr4 are turned off. When the transistor Tr1 is turned off, the potential $V_{GND}$ is retained at the first terminal of the capacitor C1 (node ND1); and when the transistor Tr2 is turned off, the potential $V_1$ is retained at the second terminal of the capacitor C1, the first terminal of the capacitor C2, and the gate of the transistor Tr3 (node ND2).

Here, a high bias is assumed to be applied between the first terminal and the second terminal of the transistor Tr3 by the potential $V_1$ of the node ND3 and the potential of the wiring AL. At this time, the transistor Tr3 is turned on and current flows in the direction from the first terminal to the second terminal of the transistor Tr3.

The potential of the node ND3 is raised by that current because the transistor Tr4 and the transistor Tr5 are off. Note that the voltage between the first terminal and the second terminal of the capacitor C2 is approximately 0 V and the transistor Tr2 is off (the node ND2 is in an electrically floating state); hence, the gate-source voltage of the transistor Tr3 remains approximately 0 V when the potential of the node ND3 rises.

The potential of the node ND3 is raised until the transistor Tr3 is turned off. Since the gate-source voltage of the transistor Tr3 is approximately 0 V, the transistor Tr3 is turned off when the threshold voltage of the transistor Tr3 becomes 0 or more or exceeds 0. That is, the transistor Tr3 is turned off when a back gate-source voltage of the transistor Tr3 becomes a voltage at which the threshold voltage of the transistor Tr3 is 0. When the back gate-source voltage of the transistor Tr3 at which the threshold voltage of the transistor Tr3 is 0 is denoted as $V_c$, the potential of the node ND3 is $V_0-V_c$.

Since the node ND2 is in the electrically floating state, the potential of the node ND2 rises concurrently with the rising of the potential of the node ND3 from $V_1$ to $V_0-V_c$. The voltage raised by the node ND2 is determined by the capacitive coupling coefficient between the node ND2 and the node ND3.

In addition, the node ND1 is also in the electrically floating state because the transistor Tr1 is off. Hence, the potential of the node ND1 rises when the potential of the node ND2 rises. The voltage raised by the node ND1 is determined by the capacitive coupling coefficient between the node ND1 and the node ND2.

In the case where the pixel PIX shown in FIG. 7(A) is employed, electrical continuity is established between the gate and the second terminal of the transistor Tr3 from Time T3 to Time T4; thus, the pixel PIX shown in FIG. 7(A) operates in a manner similar to that of the pixel PIX shown in FIG. 6(A). For the operation of the pixel PIX shown in FIG. 7(A) after Time T4, the following description of the pixel PIX shown in FIG. 6(A) is referred to.

[From Time T4 to Time T5 (Correction Data Writing Period)]

From Time T4 to Time T5, a high-level potential is applied to the wiring GL1 and the wiring GL2 and a low-level potential is applied to the wiring GL4. Thus, a high-level potential is applied to the gate of each of the transistor Tr1, the transistor Tr2, and the transistor Tr4, so that the transistor Tr1, the transistor Tr2, and the transistor Tr4 are turned on, and a low-level potential is applied to the gate of the transistor Tr7, so that the transistor Tr7 is turned off. Consequently, the node ND4 is brought into an electrically floating state and the potential of the node ND4 is retained at the first terminal of the capacitor C3.

Although signals are simultaneously input to the wiring GL1, the wiring GL2, and the wiring GL4 at Time T4 in this operation example, the signals sent from the wirings might be delayed in an accrual circuit and the signals are not always input to the pixel PIX simultaneously. In view of the signal delay, a high-level potential is preferably applied to the wiring GL1 and the wiring GL2 at Time T4 after the node ND4 is surely brought into an electrically floating state. That is, a low-level potential is preferably applied to the wiring GL4 before Time T4.

A potential $V_W$, which corresponds to correction data, is applied to the wiring WDL from Time T4 to Time T5.

Since the transistor Tr1 is on, electrical continuity is established between the wiring DL and the node ND1. Thus, the potential $V_{GND}$ is applied from the wiring DL to the node ND1. Since the transistor Tr2 is on, electrical continuity is established between the wiring WDL and the node ND2. Thus, the potential $V_W$ is applied from the wiring WDL to the node ND2.

Since the transistor Tr4 is on, electrical continuity is established between the wiring VL and the node ND3. Thus, the potential $V_1$ is applied from the wiring VL to the node ND3. Note that the transistor Tr7 is off (the node ND4 is in an electrically floating state); hence, the potential of the node ND4 changes with the potential of the node ND3. Here, when the capacitive coupling coefficient between the node ND3 and the node ND4 is assumed to be 1, the potential of the node ND4 changes from $V_0$ to $V_1+V_c$. At this time, the back gate-source voltage of the transistor Tr3 remains $V_c$ as from Time T3 to Time T4; hence, the threshold voltage of the transistor Tr3 is 0 from Time T4 to Time T5.

[From Time T5 to Time T6 (Image Data Writing Period)]

From Time T5 to Time T6, a low-level potential is applied to the wiring GL2. Thus, a low-level potential is applied to the gate of the transistor Tr2, so that the transistor Tr2 is turned off. When the transistor Tr2 is turned off, the potential $V_W$ is retained at the second terminal of the capacitor C1, the first terminal of the capacitor C2, and the gate of the transistor Tr3 (node ND2).

A potential $V_{DATA}$, which corresponds to image data, is applied to the wiring DL from Time T5 to Time T6.

Since the transistor Tr1 is on, electrical continuity is established between the wiring DL and the node ND1. Thus, the potential $V_{DATA}$ is applied from the wiring DL to the node ND1. Note that the transistor Tr2 is off (the node ND2 is in an electrically floating state); hence, the potential of the node ND2 changes with the potential of the node ND1. In particular, when the capacitance value of the capacitor C1 is sufficiently larger than that of the capacitor C2, the capacitive coupling coefficient between the node ND1 and the node ND2 gets extremely close to 1, and accordingly, the amount of change in the potential of the node ND1 is almost equal to that of the node ND2. In that case, the node ND2 becomes $V_{DATA} V_W$.

[From Time T6 to Time T7 (Image Display Period)]

From Time T6 to Time T7, a low-level potential is applied to the wiring GL1. Thus, a low-level potential is applied to the gate of the transistor Tr1, so that the transistor Tr1 is turned off. When the transistor Tr1 is turned off, the potential $V_{DATA}$ is retained at the first terminal of the capacitor C1 (node ND1).

After a low-level potential is applied to the wiring GL1, a high-level potential is applied to the wiring GL3. Thus, a high-level potential is applied to the gate of the transistor Tr5, so that the transistor Tr5 is turned on. When the transistor Tr5 is turned on, a current flowing from the wiring AL is supplied to the input terminal of the light-emitting element LD through the transistor Tr3 and the transistor Tr5, whereby the light-emitting element LD emits light.

The luminance of the light-emitting element LD at this time is determined by a current flowing to the light-emitting element LD. According to Kirchhoff's law, the current flowing to the light-emitting element LD is substantially equal to a current flowing between the source and the drain of the transistor Tr3; thus, the luminance of the light-emitting element LD is determined by the gate-source voltage of the transistor Tr3. Each of the gate and the source of the transistor Tr3 is electrically connected to the first terminal and the second terminal of the capacitor C2; thus, the luminance of the light-emitting element LD is determined by the potential of the gate of the transistor Tr3, $V_{DATA}+V_W$. Thus, the light-emitting element LD emits light with a luminance corresponding to the correction data and the image data.

At this time, a voltage is applied between the input terminal and the output terminal of the light-emitting element LD and a predetermined potential is applied to the wiring CAT, so that the potential of an electrical connection point of the second terminal of the transistor Tr3, the first terminal of the transistor Tr4, the first terminal of the transistor Tr$y$, the second terminal of the capacitor C2, and the second terminal of the capacitor C3 increases. Since the node ND1, the node ND2, and the node ND4 are each in an electrically floating state, when the potential of the electrical connection point increases, the potentials of the node ND1, the node ND2, and the node ND4 are also increased by capacitive coupling in some cases. In the timing chart of FIG. 8, the potentials of the node ND1 and the node ND2 after Time T7 are higher than those during the period from Time T6 to Time T7.

As described above, the image data and the threshold voltage of the driving transistor can be corrected in the pixel PIX shown in FIG. 6(A) by the operation from Time T1 to Time T7 and around the time periods in the timing chart of FIG. 8.

<Operation Example of Display Device>

In the case where the display device DD including the pixel PIX shown in FIG. 6(A) has a large size, the wiring electrically connected to the pixel PIX has a high resistance to increase the time required for processing such as correction of the threshold voltage of the driving transistor. The operation frequency of the display device might decrease accordingly when an image is displayed in the display device normally.

An operation example for solving the above will be described. This operation example is described on the assumption that the display device includes the display portion PA in which a plurality of the pixels PIX shown in FIG. 6(A) are arranged in a matrix.

Figure 9:
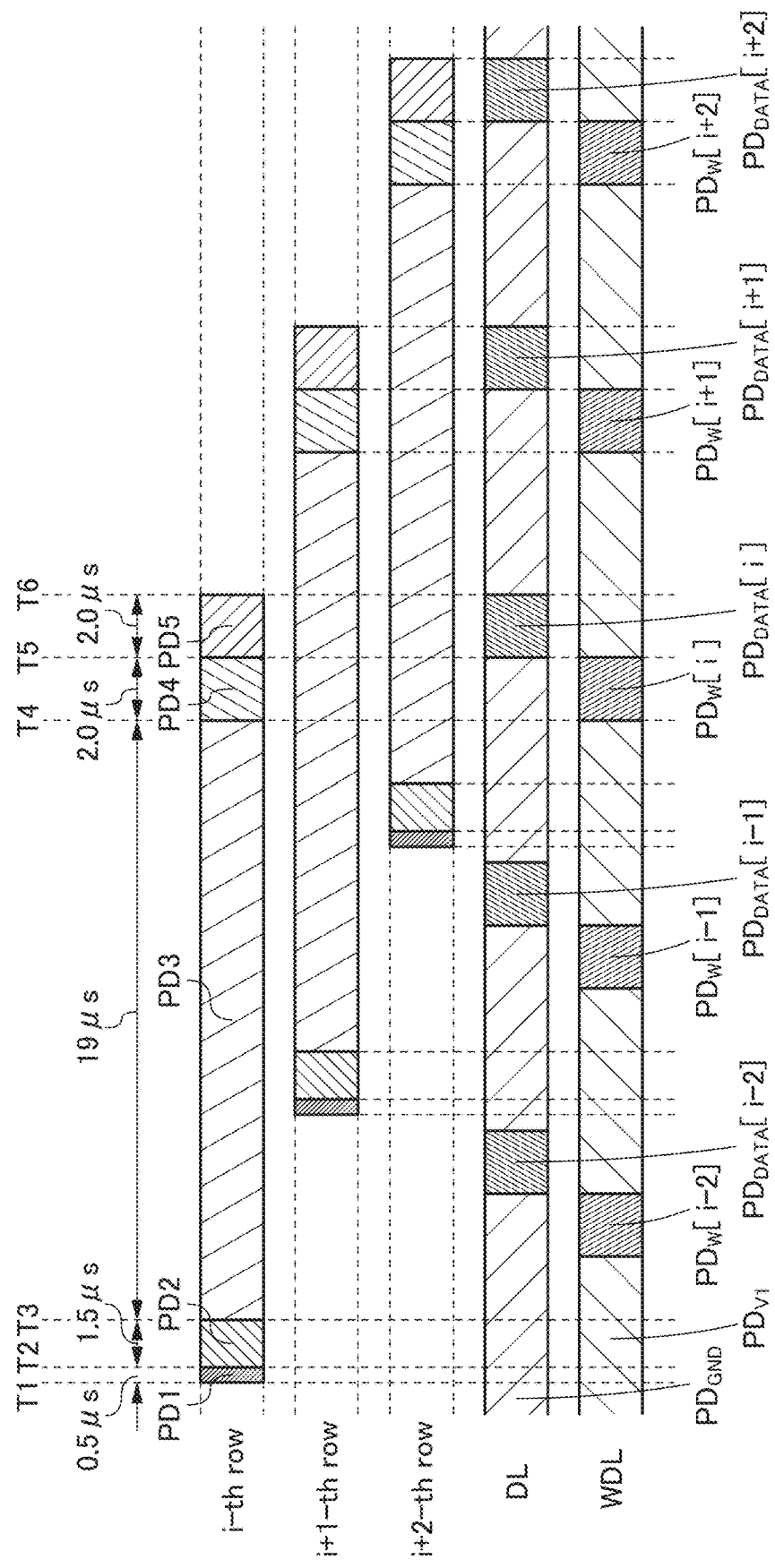
FIG. 9 A diagram showing an example of the pixel operation and the timing of voltage application to a wiring.

FIG. 9 shows the operation order of the pixels PIX included in each of an i-th row, an i+1-th row, and an i+2-th row (i is an integer of 3 or more) included in the display portion PA, the timing of transfer of data from the wiring DL, and the timing of transfer of data from the wiring WDL.

Time T1 to Time T6 shown in FIG. 9 correspond to Time T1 to Time T6 shown in the timing chart of FIG. 8. That is, Period PD1 to Period PD5 shown in the i-th row correspond to the "first initialization period", "second initialization period", "threshold voltage correction period", "correction data writing period", and "image data writing period", respectively, in the aforementioned operation example of the pixel circuit. In FIG. 9, Period PD1 to Period PD5 have a time of, as an example, 0.5 µs, 1.5 µs, 19 µs, 2.0 µs, and 2.0 µs, respectively.

In particular, as described above, it might take time for processing such as correction of the threshold voltage of the driving transistor in the case where the display device including the pixel PIX has a large size. For that reason, the time of Period PD3 is set longer than that of other periods (PD1, PD2, PD4, PD5).

In the operation of pixel PIX shown in FIG. 9, particularly in the operation in each of Period PD4 and Period PD5, appropriate correction data and image data are assumed to be written to each pixel PIX included in each of the i-th row, the i+1-th row, and the i+2-th row. Thus, in the following description, the pixels PIX in the same column among the plurality of pixels PIX included in the i-th row, the i+1-th row, and the i+2-th row will be described.

As shown in FIG. 9, the operation in Period PD1 to Period PD5 is performed in the pixels PIX in each of the i+1-th row and the i+2-th row as well as in the i-th row. Note that Period PD1, Period PD2, Period PD4, and Period PD5 do not overlap with each other in the i-th row, the i+1-th row, and the i+2-th row. In other words, when the pixels PIX in a row are in any one of Period PD1, Period PD2, Period PD4, and Period PD5, the pixels PIX in the other rows are in Period PD3.

In the operation example of the display device shown in FIG. 9, operation of data transfer from the wiring DL includes Period $PD_{GND}$ and Period $PD_{DATA}$[i-2] to $PD_{DATA}$[i+2]. Period $PD_{GND}$ is a period during which the potential $V_{GND}$ is applied to the wiring DL. Period $PD_{DATA}$[k] (k is an integer greater than or equal to i-2 and less than or equal to i+2) is a period during which a potential corresponding to the image data that is to be written to the node ND1 in the pixels PIX included in a k-th row is applied to the wiring DL.

In the operation example of the display device shown in FIG. 9, operation of data transfer from the wiring WDL includes Period $PD_{V1}$ and Period $PD_W$[i-2] to $PD_W$[i+2]. Period $PD_{V1}$ is a period during which the potential $V_1$ is applied to the wiring WDL. Period $PD_W$[k] is a period during which a potential (corresponding to $V_W$ described in the aforementioned operation example of the pixel circuit) corresponding to the correction data that is to be written to the node ND2 in the pixels PIX included in a k-th row is applied to the wiring WDL.

In the operation of the pixels PIX included in a row of the plurality of rows, in Period PD1 (first initialization period), the potential $V_{GND}$ is applied to the wiring DL so that the node ND1 has the potential $V_{GND}$. That is, when the operation in Period PD1 is performed in the pixels PIX in the row, the operation in Period $PD_{GND}$ is performed in the wiring DL. Also in Period PD1, the potential $V_1$ is applied to the wiring WDL so that the node ND2 has the potential $V_1$. That is, when the operation in Period PD1 is performed in the pixels PIX in the row, the operation in Period $PD_{V1}$ is performed in the wiring WDL.

In the operation of the pixels PIX included in a row of the plurality of rows, in Period PD4 (correction data writing period), a potential corresponding to the correction data is applied to the wiring WDL so that the correction data is written to the node ND2. That is, when the operation in Period PD4 is performed in the pixels PIX in an I-th row (I is an integer of 1 or more), the operation in Period $PD_W$[I] is performed in the wiring WDL.

In the operation of the pixels PIX included in a row of the plurality of rows, in Period PD5 (image data writing period), a potential corresponding to the image data is applied to the wiring DL so that the image data is written to the node ND1. That is, when the operation in Period PD5 is performed in the pixels PIX in the I-th row, the operation in Period $PD_{DATA}$[I] is performed in the wiring DL.

As shown in FIG. 9, when the threshold voltage of the driving transistor is corrected in the pixels PIX in the i+1-th row, the operation in Period PD3 is performed in the pixels PIX in the row. In that case, writing of a potential to the node ND1 through the wiring DL and writing of a potential to the node ND2 through the wiring WDL do not need to be performed in the pixels PIX in the i+1-th row; thus, the potentials of the wiring DL and the wiring WDL can be changed. Hence, when the operation in Period PD3 is performed in the pixels PIX in the i+1-th row, the potential of the wiring DL and the potential of the wiring WDL can be changed in the operation in each of Period PD4 and Period PD5 in the pixels PIX in the i-th row. That is, while the threshold voltage of the driving transistor is corrected in the pixels PIX in the i+1-th row, the image data and the correction data can be written to the pixels PIX in the i-th row. Similarly, the potential of the wiring DL and the potential of the wiring WDL can be changed in the correction of the threshold voltage of the driving transistor in the pixels PIX in the i+2-th row as shown in FIG. 9, so that the image data and the correction data can be written to the pixels PIX in the i+1-th row.

Note that in FIG. 9, the correction data and the image data are written to the pixels PIX in each row from the i-th row to the i+2-th row; however, the order of writing of the correction data and the image data to the pixels PIX is not limited to that in FIG. 9. For example, the correction data and the image data can be sequentially written to the pixels PIX in odd-numbered rows, and then sequentially written to the pixels PIX in even-numbered rows.

Note that the operation method of one embodiment of the present invention is not limited to Period PD1 to Period PD5 described above. In this specification and the like, the operation periods shown in FIG. 9 are classified on the basis of the functions and shown as operation periods independent of each other. However, in an actual operation or the like, it may be difficult to separate the operation of the pixel PIX on the basis of the functions, and one operation may be associated with a plurality of other operations or several operations may be associated with one operation. Therefore, the operation periods shown in FIG. 9 are not limited by any of the operation periods described in the specification, and can be differently determined as appropriate depending on situations. Specifically, the order of operation periods can be changed or an operation can be added or omitted depending on situations. For example, in the description of this specification and the like, each of Period PD1 and Period PD2 is divided into the first initialization period and the second initialization period in the operation of the pixel PIX shown in FIG. 9; alternatively, the first initialization period and the second initialization period can be performed at the same time. Thus, the first initialization period and the second initialization period can be collectively denoted as an initialization period.

As described above, the image data and the correction data are written to the pixels PIX in a row while the threshold voltage of the driving transistor in the pixels PIX in another row is corrected, which inhibits a reduction in the operation frequency of the display device due to the correction of the threshold voltage of the driving transistor and increases the operation frequency compared with that in conventional operation methods.

<Circuit Configuration Example of Source Driver Circuit SD and Circuit WSD>

Here, description is made on a circuit configuration example of the source driver circuit SD and the circuit WSD, in which the pixel PIX and the peripheral circuit have the configuration shown in FIG. 5(A) and the pixel PIX performs the operation shown in the timing chart of FIG. 8.

Figure 10A:
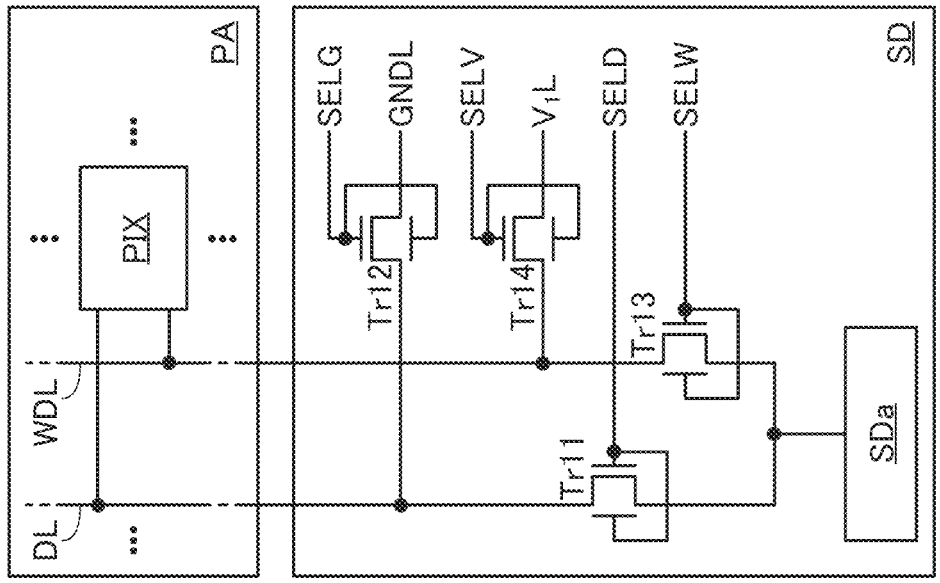
FIGS. 10A-10B Block diagrams showing configuration examples of a display portion and its peripheral circuit.

FIG. 10(A) shows circuit configuration examples of the source driver circuit SD and the circuit WSD in FIG. 5(A). Note that FIG. 10(A) also shows the display portion PA so as to illustrate the connection with the pixel PIX.

The source driver circuit SD includes a transistor Tr11, a transistor Tr12, and a circuit SDa. The circuit WSD includes a transistor Tr13, a transistor Tr14, and a circuit WSDa.

Although the transistor Tr11 to the transistor Tr14 are n-channel transistors in FIG. 10, all or some of the transistor Tr11 to the transistor Tr14 may be p-channel transistors. The transistor Tr11 to the transistor Tr14 are preferably OS transistors with a low off-state current.

Although the transistor Tr11 to the transistor Tr14 are transistors having back gates in FIG. 10, all or some of the transistor Tr11 to the transistor Tr14 may be transistors without back gates. Although the gate and the back gate of each of the transistor Tr11 to the transistor Tr14 are electrically connected to each other in order to increase the on-state current, all or some of the back gates of the transistor Tr11 to the transistor Tr14 may be electrically connected to a wiring that receives a given potential.

In the source driver circuit SD, a first terminal of the transistor Tr11 is electrically connected to the circuit SDa, and a second terminal of the transistor Tr11 is electrically connected to a first terminal of the transistor Tr12 and the wiring DL. A gate of the transistor Tr11 is electrically connected to a wiring SELD, a second terminal of the transistor Tr12 is electrically connected to a wiring GNDL, and a gate of the transistor Tr12 is electrically connected to a wiring SELG.

The circuit SDa has a function of generating the potential $V_{DATA}$ based on an image to be displayed in the display portion PA and outputting the potential $V_{DATA}$ to the first terminal of the transistor Tr11. The circuit SDa can have, for example, the configuration of the source driver circuit SD shown in FIG. 1. That is, the circuit SDa can include the shift register SR, the latch circuit LAT, the level shifter circuit LVS, the digital-analog converter circuit DAC, the amplifier circuit AMP, and the data bus wiring DB in order to generate image data. In that case, the output terminal of the amplifier circuit AMP is electrically connected to the first terminal of the transistor Tr11.

In the circuit WSD, a first terminal of the transistor Tr13 is electrically connected to the circuit WSDa, and a second terminal of the transistor Tr13 is electrically connected to a first terminal of the transistor Tr14 and the wiring WDL. A gate of the transistor Tr13 is electrically connected to a wiring SELW, a second terminal of the transistor Tr14 is electrically connected to a wiring $V_1L$, and a gate of the transistor Tr14 is electrically connected to a wiring SELV.

The circuit WSDa has a function of generating the potential $V_W$ based on correction data that is used to correct an image displayed in the display portion PA, and outputting the potential $V_W$ to the first terminal of the transistor Tr13. The circuit WSDa can include, like the circuit SDa for example, the shift register SR, the latch circuit LAT, the level shifter circuit LVS, the digital-analog converter circuit DAC, the amplifier circuit AMP, and the data bus wiring DB. In that case, the output terminal of the amplifier circuit AMP is electrically connected to the first terminal of the transistor Tr13.

The wiring SELD, the wiring SELG, the wiring SELW, and the wiring SELV are each a wiring that supplies a potential to the gate of each of the transistor Tr11 to the transistor Tr14, and the transistor Tr11 to the transistor Tr14 can be turned on or off with that potential.

The wiring GNDL is a wiring that supplies the reference potential $V_{GND}$ to the wiring DL, and the wiring $V_1L$ is a wiring that supplies the potential $V_1$ to the wiring WDL.

Here, the operation of the source driver circuit SD and the circuit WSD in FIG. 10(A) will be specifically described on the assumption that the pixel PIX operates as in the operation example in the timing chart of FIG. 8.

Before Time T4 and after Time T5, the potential of the wiring WDL is $V_1$. Before Time T4 and after Time T5, a low-level potential is applied to the wiring SELW in the circuit WSD so that the transistor Tr13 is turned off, and a high-level potential is applied to the wiring SELV so that the transistor Tr14 is turned on. As a result, electrical continuity is established between the wiring $V_1L$ and the wiring WDL, whereby the wiring WDL has a potential of $V_1$.

From Time T4 to Time T5, the potential of the wiring WDL is $V_W$. From Time T4 to Time T5, a high-level potential is applied to the wiring SELW in the circuit WSD so that the transistor Tr13 is turned on, and a low-level potential is applied to the wiring SELV so that the transistor Tr14 is turned off. Then, the potential $V_W$ corresponding to the correction data is output from the circuit WSDa, whereby the wiring WDL has a potential of $V_W$.

Before Time T5 and after Time T6, the potential of the wiring DL is $V_{GND}$. Before Time T5 and after Time T6, a low-level potential is applied to the wiring SELD in the source driver circuit SD so that the transistor Tr11 is turned off, and a high-level potential is applied to the wiring SELG so that the transistor Tr12 is turned on. As a result, electrical continuity is established between the wiring GNDL and the wiring DL, whereby the wiring DL has a potential of $V_{GND}$.

From Time T5 to Time T6, the potential of the wiring DL is $V_{DATA}$. From Time T5 to Time T6, a high-level potential is applied to the wiring SELD in the source driver circuit SD so that the transistor Tr11 is turned on, and a low-level potential is applied to the wiring SELG so that the transistor Tr12 is turned off. Furthermore, the potential $V_{DATA}$ corresponding to the image data is output from the circuit SDa, whereby the wiring DL has a potential of $V_{DATA}$.

In the case where the pixel PIX shown in FIG. 5(A) performs the operation of the timing chart shown in FIG. 8, an appropriate potential can be applied to each of the wiring DL and the wiring WDL as appropriate when the source driver circuit SD and the circuit WSD have the configuration shown in FIG. 10(A).

Figure 10B:
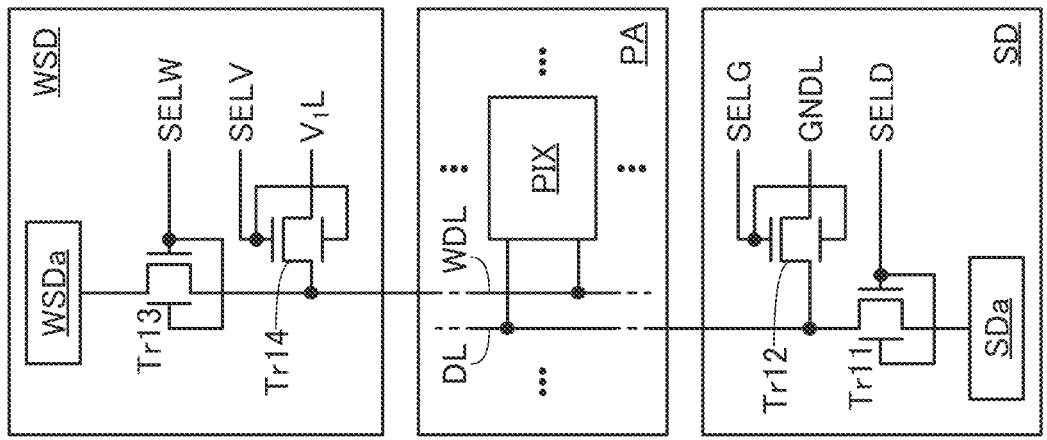

In the case where the pixel PIX and the peripheral circuit have the configuration shown in FIG. 5(B) and the pixel PIX performs the operation of the timing chart shown in FIG. 8, the source driver circuit SD can have, for example, the circuit configuration in FIG. 10(B).

The source driver circuit SD shown in FIG. 10(B) includes the transistor Tr11 to the transistor Tr14 and the circuit SDa. For the transistor Tr11 to the transistor Tr14 and the circuit SDa, the description of the transistor Tr11 to the transistor Tr14 and the circuit SDa in FIG. 10(A) can be referred to.

The circuit SDa is electrically connected to the first terminal of the transistor Tr11 and the first terminal of the transistor Tr13. The second terminal of the transistor Tr11 is electrically connected to the first terminal of the transistor Tr12 and the wiring DL, and the second terminal of the transistor Tr13 is electrically connected to the first terminal of the transistor Tr14 and the wiring WDL. The second terminal of the transistor Tr12 is electrically connected to the wiring GNDL, and the second terminal of the transistor Tr14 is electrically connected to the wiring $V_1L$. The gate of the transistor Tr11 is electrically connected to the wiring SELD, the gate of the transistor Tr12 is electrically connected to the wiring SELG, the gate of the transistor Tr13 is electrically connected to the wiring SELW, and the gate of the transistor Tr14 is electrically connected to the wiring SELV.

For the wiring SELD, the wiring SELG, the wiring SELW, the wiring SELV, the wiring $V_1L$, and the wiring GNDL, the description of the wiring SELD, the wiring SELG, the wiring SELW, the wiring SELV, the wiring $V_1L$, and the wiring GNDL in FIG. 10(A) is referred to, respectively.

With the connection of the transistor Tr11, the transistor Tr13, and the circuit SDa, the source driver circuit SD shown in FIG. 5(B) has a configuration in which one of the wiring DL and the wiring WDL is selected and a potential is applied to the selected wiring. The circuit SDa has a function of generating the potential $V_{DATA}$ corresponding to the image data, which is to be applied to the wiring DL, and the potential $V_W$ corresponding to the correction data, which is to be applied to the wiring WDL. Hence, in the case where the circuit SDa generates and outputs the potential $V_{DATA}$, the potential $V_{DATA}$ can be applied to the wiring DL when the transistor Tr11 is turned on and the transistor Tr13 is turned off; in the case where the circuit SDa generates and outputs the potential $V_W$, the potential $V_W$ can be applied to the wiring WDL when the transistor Tr11 is turned off and the transistor Tr13 is turned on.

In the case where the reference potential $V_{GND}$ is applied to the wiring DL, the transistor Tr11 is turned off and the transistor Tr12 is turned on. In the case where the reference potential $V_1$ is applied to the wiring WDL, the transistor Tr13 is turned off and the transistor Tr14 is turned on.

Here, the operation of the source driver circuit SD in FIG. 10(B) will be specifically described on the assumption that the pixel PIX operates as in the operation example in the timing chart of FIG. 8.

Before Time T4 and after Time T5, the potential of the wiring WDL is $V_1$. Before Time T4 and after Time T5, a low-level potential is applied to the wiring SELW in the source driver circuit SD so that the transistor Tr13 is turned off, and a high-level potential is applied to the wiring SELV so that the transistor Tr14 is turned on. As a result, electrical continuity is established between the wiring $V_1L$ and the wiring WDL, whereby the wiring WDL has a potential of $V_1$.

From Time T4 to Time T5, the potential of the wiring WDL is $V_W$. From Time T4 to Time T5, a high-level potential is applied to the wiring SELW in the source driver circuit SD so that the transistor Tr13 is turned on, and a low-level potential is applied to the wiring SELV so that the transistor Tr14 is turned off. Then, the potential $V_W$ corresponding to the correction data is output from the circuit SDa, whereby the wiring WDL has a potential of $V_W$.

Before Time T5 and after Time T6, the potential of the wiring DL is $V_{GND}$. Before Time T5 and after Time T6, a low-level potential is applied to the wiring SELD in the source driver circuit SD so that the transistor Tr11 is turned off, and a high-level potential is applied to the wiring SELG so that the transistor Tr12 is turned on. As a result, electrical continuity is established between the wiring GNDL and the wiring DL, whereby the wiring DL has a potential of $V_{GND}$.

From Time T5 to Time T6, the potential of the wiring DL is $V_{DATA}$. From Time T5 to Time T6, a high-level potential is applied to the wiring SELD in the source driver circuit SD so that the transistor Tr11 is turned on, and a low-level potential is applied to the wiring SELG so that the transistor Tr12 is turned off. Furthermore, the potential $V_{DATA}$ corresponding to the image data is output from the circuit SDa, whereby the wiring WDL has a potential of $V_{DATA}$.

In the case where the pixel PIX shown in FIG. 5(B) performs the operation of the timing chart shown in FIG. 8, an appropriate potential can be applied to each of the wiring DL and the wiring WDL as appropriate when the source driver circuit SD has the configuration shown in FIG. 10(B).

Note that in this specification and the like, components are classified on the basis of the functions and shown as blocks independent of each other in block diagrams. However, in an actual circuit or the like, it may be difficult to separate components on the basis of the functions, and one circuit may be associated with a plurality of functions or several circuits may be associated with one function. Therefore, blocks in the block diagrams are not limited by any of the components described in the specification, and can be differently determined as appropriate depending on situations.

Note that one embodiment of the present invention is not limited to the aforementioned pixels PIX shown in FIGS. 2(A) and 2(B), FIG. 3, and FIGS. 5(A) and 5(B). In one embodiment of the present invention, the configurations of the pixels PIX shown in FIGS. 2(A) and 2(B), FIG. 3, and FIGS. 5(A) and 5(B) may be changed as appropriate. For example, although the image data retention portion 101, the driver circuit portion 102, and the correction data retention portion 104 are electrically connected in the pixels PIX shown in FIGS. 5(A) and 5(B), the electrical connection between the image data retention portion 101 and the driver circuit portion 102 may be omitted. That is, the image data can be transmitted from the image data retention portion 101 to the driver circuit portion 102 through the correction data retention portion 104. For another example, the electrical connection between the driver circuit portion 102 and the correction data retention portion 104 may be omitted. That is, the correction data is transmitted from the correction data retention portion 104 to the image data retention portion 101, and corrected image data may be generated in the image data retention portion 101 and transmitted to the driver circuit portion 102.

Note that this embodiment can be combined with the other embodiments and/or the examples in this specification as appropriate.

(Embodiment 2)

In this embodiment, structure examples of a display device including an EL element as a display element will be described. Note that in this embodiment, the driver circuit portion and the threshold voltage correction circuit portion described in Embodiment 1 are not described.

Figure 11A:
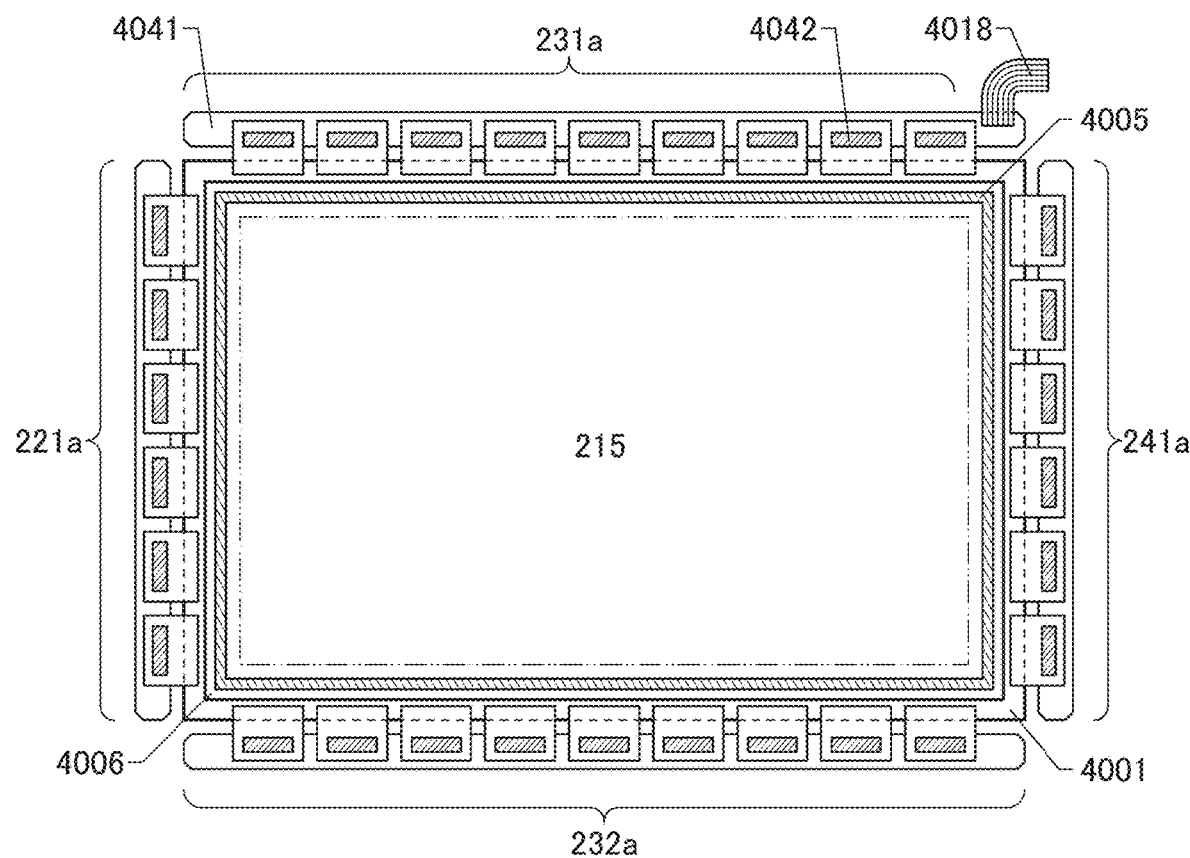
FIGS. 11A-11B Top views each showing an example of a display device.

In FIG. 11(A), a sealant 4005 is provided to surround a display portion 215 provided over a first substrate 4001, and the display portion 215 is sealed with the sealant 4005 and a second substrate 4006.

A pixel array including the pixel PIX described in Embodiment 1 is provided in the display portion 215.

In FIG. 11(A), a scan line driver circuit 221a, a signal line driver circuit 231a, a signal line driver circuit 232a, and a common line driver circuit 241a each include a plurality of integrated circuits 4042 provided over a printed board 4041.

The integrated circuits 4042 are formed using a single crystal semiconductor or a polycrystalline semiconductor. The signal line driver circuit 231a and the signal line driver circuit 232a have a function of the source driver circuit SD described in Embodiment 1. The scan line driver circuit 221a has a function of the gate driver circuit GD described in Embodiment 1. The common line driver circuit 241a has a function of applying a predetermined potential or supplying current to a predetermined circuit element included in the pixel PIX described in Embodiment 1. In particular, the common line driver circuit 241a and the pixel PIX can be electrically connected through the wiring VA shown in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a have a function of supplying selection signals to the display portion 215. The integrated circuits 4042 included in the signal line driver circuit 231a and the signal line driver circuit 232a have a function of supplying an image signal to the display portion 215. The integrated circuits 4042 are mounted on a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

Figure 11B:
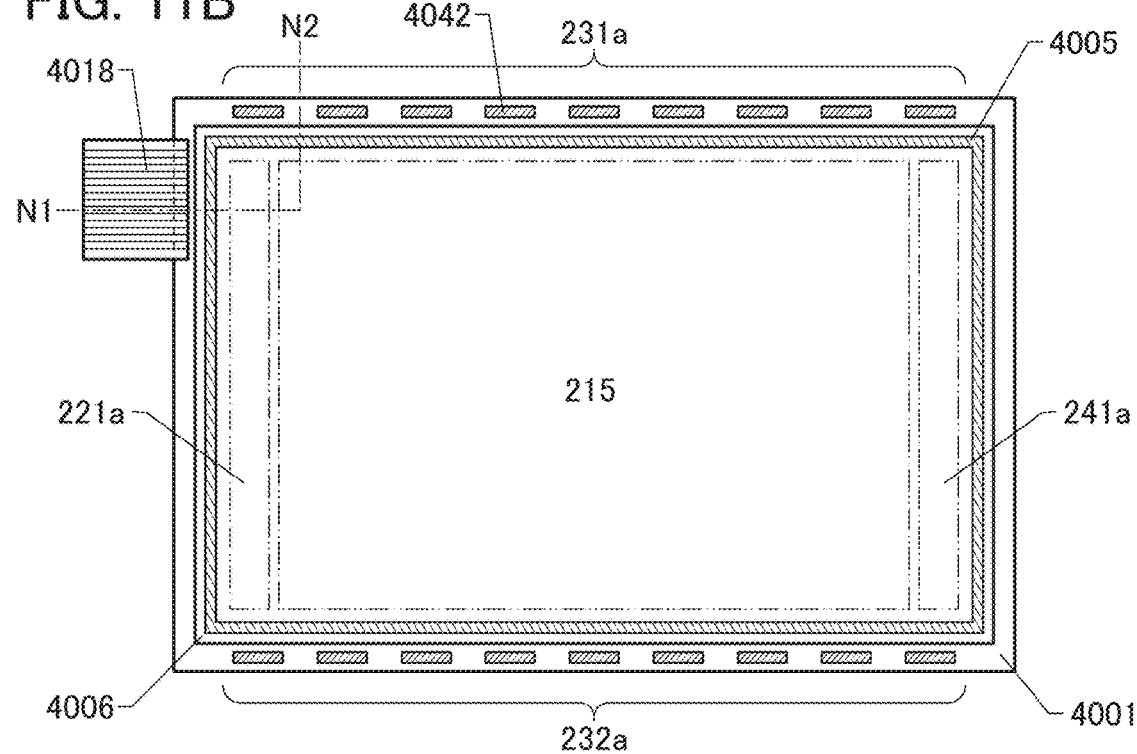

FIG. 11(B) shows an example of mounting the integrated circuits 4042 included in the signal line driver circuit 231a and the signal line driver circuit 232a by a COG method. Some or all of the driver circuits can be integrally formed over the same substrate as the display portion 215, whereby a system-on-panel can be formed.

In the example shown in FIG. 11(B), the scan line driver circuit 221a and the common line driver circuit 241a are formed over the same substrate as the display portion 215. When the driver circuits are formed concurrently with the pixel circuit in the display portion 215, the number of components can be reduced. Thus, the productivity can be improved.

In FIG. 11(B), the sealant 4005 is provided to surround the display portion 215, the scan line driver circuit 221a, and the common line driver circuit 241a that are provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element by the first substrate 4001, the sealant 4005, and the second substrate 4006.

Although the signal line driver circuit 231a and the signal line driver circuit 232a are formed separately and mounted on the first substrate 4001 in the example shown in FIG. 11(B), one embodiment of the present invention is not limited to this structure. The scan line driver circuit may be formed separately and then mounted, or part of the signal line driver circuit or part of the scan line driver circuit may be formed separately and then mounted.

The display device sometimes encompasses a panel in which the display element is sealed, and a module in which an IC or the like including a controller is mounted on the panel.

The display portion and the scan line driver circuit provided over the first substrate each include a plurality of transistors. As the transistors, an OS transistor or a transistor including silicon in its channel formation region can be used.

A transistor included in a peripheral driver circuit and a transistor included in the pixel circuit of the display portion may have the same structure or different structures. Transistors included in the peripheral driver circuit may have the same structure or a combination of two or more kinds of structures. Similarly, transistors included in the pixel circuit may have the same structure or a combination of two or more kinds of structures.

An input device 4200 describe later can be provided over the second substrate 4006. The display device shown in FIGS. 11A and 11B and provided with the input device 4200 can serve as a touch panel.

There is no limitation on a sensor element included in the touch panel of one embodiment of the present invention. A variety of sensors that can sense proximity or touch of a sensing target such as a finger or a stylus can be used as the sensor element.

A variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel of one embodiment of the present invention can have a variety of structures, including a structure in which a display device and a sensor element that are separately formed are attached to each other and a structure in which electrodes and the like included in a sensor element are provided on one or both of a substrate supporting a display element and a counter substrate.

Figure 12A:
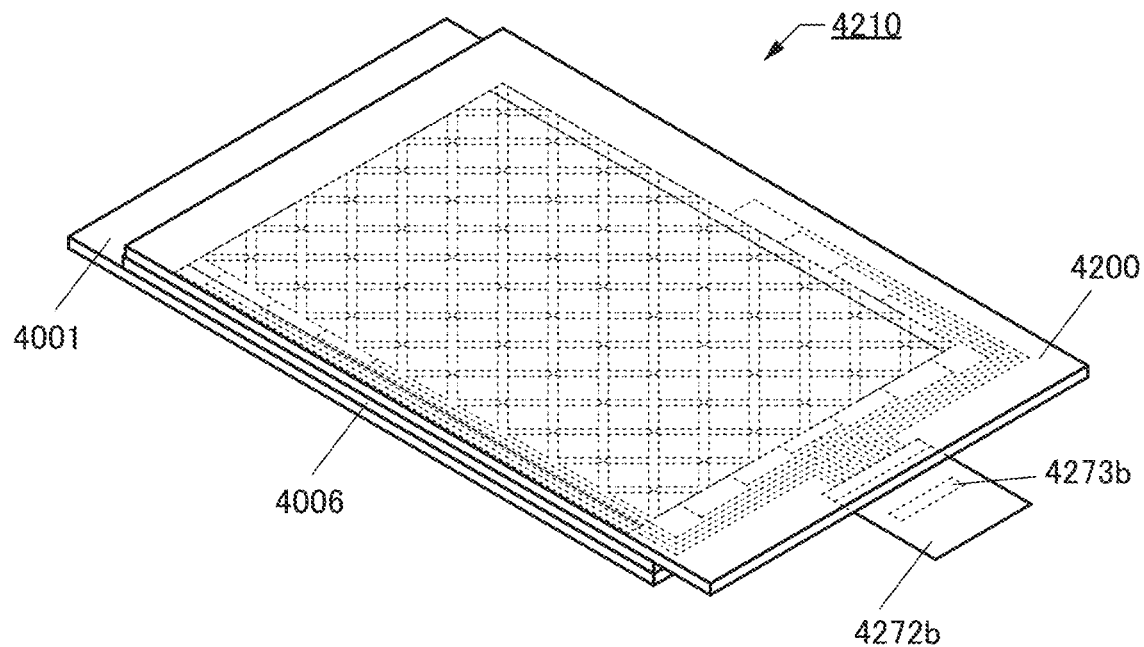
FIGS. 12A-12B Perspective views showing an example of a touch panel.
Figure 12B:
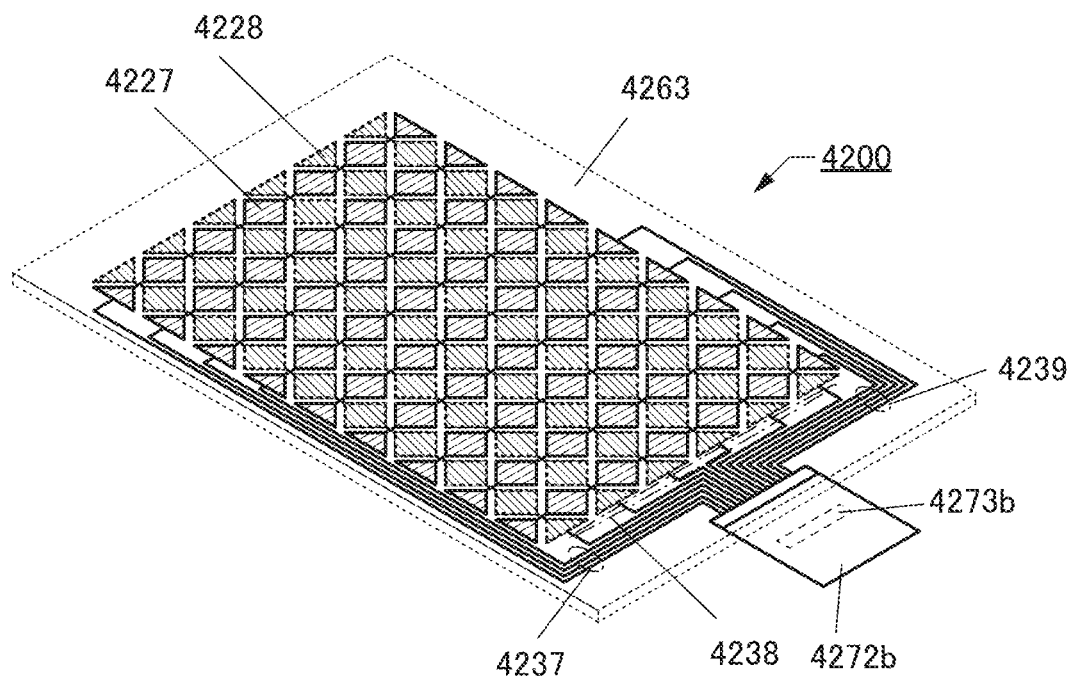

FIGS. 12(A) and 12(B) illustrate an example of a touch panel. FIG. 12(A) is a perspective view of a touch panel 4210. FIG. 12(B) is a schematic perspective view of the input device 4200. Note that for simplicity, only typical components are illustrated.

The touch panel 4210 has a structure in which a display device and a sensor element that are separately formed are attached to each other.

The touch panel 4210 includes the input device 4200 and a display device that are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wirings 4237 or the wirings 4239. The electrode 4228 can be electrically connected to the wirings 4239. An FPC 4272b is electrically connected to each of the plurality of wirings 4237 and the plurality of wirings 4238. An IC 4273b can be provided on the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor using a photoelectric conversion element may be used.

Figure 13:
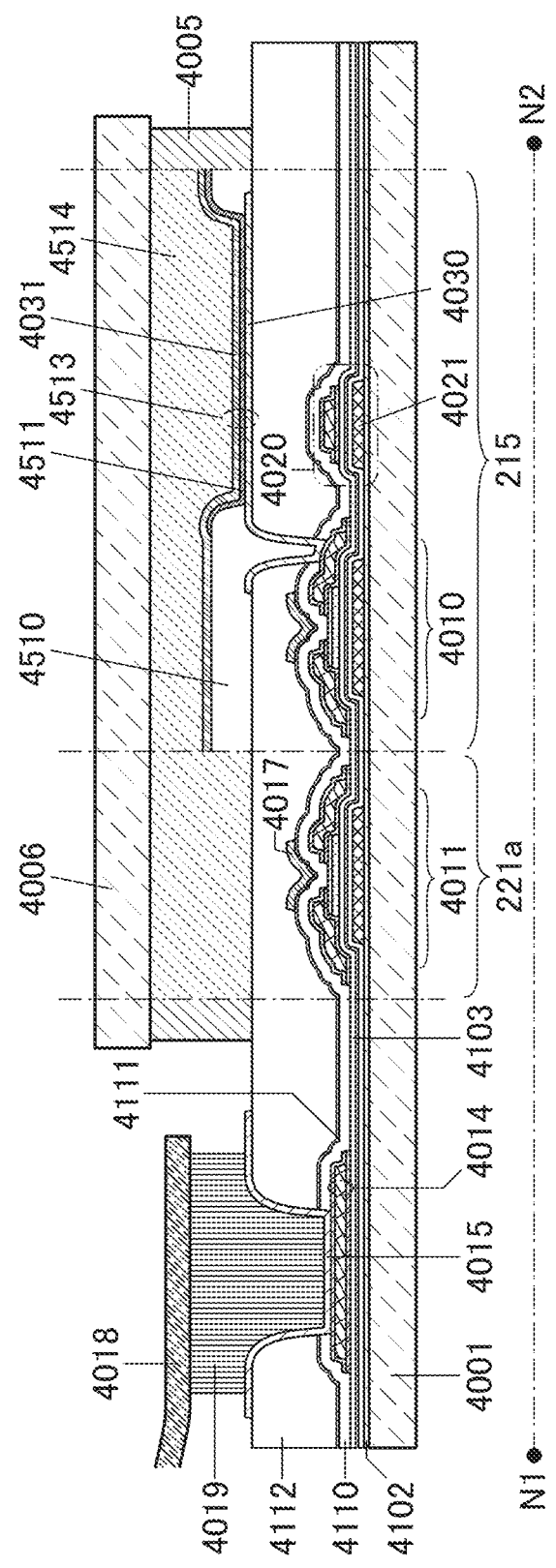
FIG. 13 A cross-sectional view showing an example of a display device.

FIG. 13 is a cross-sectional view taken along the chain line N1-N2 in FIG. 11(B). A display device shown in FIG. 13 includes an electrode 4015, and the electrode 4015 is electrically connected to a terminal included in the FPC 4018 through an anisotropic conductive layer 4019. In FIG. 13, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors, and FIG. 13 exemplifies the transistor 4010 included in the display portion 215 and the transistor 4011 included in the scan line driver circuit 221a. In the example shown in FIG. 13, the transistor 4010 and the transistor 4011 are bottom-gate transistors but may be top-gate transistors. The transistor 4010 can be the transistor Tr5 described in Embodiment 1. The transistor 4011 can be a transistor included in the gate driver circuit GD described in Embodiment 1.

In FIG. 13, the insulating layer 4112 is provided over the transistor 4010 and the transistor 4011. In addition, a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display device shown in FIG. 13 includes a capacitor 4020. The capacitor 4020 includes an electrode 4021 formed in the same step as a gate electrode of the transistor 4010, and an electrode formed in the same step as a source electrode and a drain electrode thereof. These electrodes overlap with each other with an insulating layer 4103 positioned therebetween. The capacitor 4020 can be one of the capacitor C2 or the capacitor C3 described in Embodiment 1.

In general, the capacitance of a capacitor provided in a pixel portion of a display device is set in consideration of leakage current or the like of a transistor provided in the pixel portion so that charge can be held for a predetermined period. The capacitance of the capacitor may be set in consideration of off-state current of the transistor, or the like.

The transistor 4010 provided in the display portion 215 is electrically connected to the display element.

The display device shown in FIG. 13 includes the insulating layer 4111 and the insulating layer 4102. As the insulating layer 4111 and the insulating layer 4102, insulating layers through which an impurity element does not easily pass are used. When the transistor is sandwiched between the insulating layer 4111 and the insulating layer 4102, entry of impurities from the outside to a semiconductor layer can be prevented.

A light-emitting element utilizing electroluminescence (EL element) can be used as the display element included in the display device. An EL element includes a layer containing a light-emitting compound (also referred to as an "EL layer") between a pair of electrodes. By generating a potential difference between the pair of electrodes that is greater than the threshold voltage of the EL element, holes are injected from the anode side and electrons are injected from the cathode side into the EL layer. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are recombined, and thus, a light-emitting organic compound forms an excited state, and light is emitted when the excited state returns to a ground state. Owing to such a mechanism, this light-emitting element is referred to as a current-excitation light-emitting element.

Besides the light-emitting compound, the EL layer may also include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions. Note that the description is made here using an organic EL element as a light-emitting element.

In order that light emitted from the light-emitting element can be extracted, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 13 shows an example of a light-emitting display device using a light-emitting element as a display element (also referred to as an "EL display device"). A light-emitting element 4513 that is a display element is electrically connected to the transistor 4010 provided in the display portion 215. The structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513. The light-emitting element 4513 can be the light-emitting element LD described in Embodiment 1.

The partition wall 4510 is formed using an organic insulating material or an inorganic insulating material. It is particularly preferable that a photosensitive resin material be used, and an opening portion be formed over the first electrode layer 4030 such that a side surface of the opening portion is formed to be an inclined surface having continuous curvature.

The light-emitting layer 4511 may be formed using a single layer or a plurality of layers stacked.

The emission color of the light-emitting element 4513 can be white, red, green, blue, cyan, magenta, yellow, or the like depending on the material included in the light-emitting layer 4511.

Examples of a method for achieving color display include a method in which the light-emitting element 4513 that emits white light is combined with a coloring layer and a method in which the light-emitting element 4513 that emits light of a different emission color is provided in each pixel. The former method is more productive than the latter method. On the other hand, the latter method, which requires separate formation of the light-emitting layer 4511 pixel by pixel, is less productive than the former method. However, the latter method can produce higher color purity of the emission color than the former method. In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can serve as a light-emitting material.

A protective layer may be formed over the second electrode layer 4031 and the partition wall 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In a space that is sealed by the first substrate 4001, the second substrate 4006, and the sealant 4005, a filler 4514 is provided for sealing. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic-based resin, polyimide, an epoxy-based resin, a silicone-based resin, PVB (polyvinyl butyral), EVA (ethylene vinyl acetate), or the like can be used. In addition, a drying agent may be contained in the filler 4514.

For the sealant 4005, a glass material such as a glass frit or a resin material such as a light curable resin, a thermosetting resin, or a curable resin that is cured at room temperature, such as a two-component-mixture-type resin, can be used. In addition, a drying agent may be contained in the sealant 4005.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

When the light-emitting element has a microcavity structure, light with high color purity can be extracted. Furthermore, when a microcavity structure and a color filter are used in combination, glare can be reduced and visibility of a displayed image can be increased.

The first electrode layer and the second electrode layer (also referred to as a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

The first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof and metal nitrides thereof.

The first electrode layer 4030 and the second electrode layer 4031 can be formed using a conductive composition including a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Since the transistor is easily broken owing to static electricity or the like, a protective circuit for protecting the driver circuit is preferably provided. The protective circuit is preferably formed using a nonlinear element.

Note that this embodiment can be combined with the other embodiments and/or the examples in this specification as appropriate.

(Embodiment 3)

In this embodiment, structures of transistors that can be used in the semiconductor device or the display device of one embodiment of the present invention is described.

The semiconductor device or the display device of one embodiment of the present invention can be fabricated by using a transistor with any of various modes, such as a bottom-gate transistor or a top-gate transistor. Therefore, a material used for a semiconductor layer or a transistor structure can be easily changed depending on the existing production line.

(Bottom-Gate Transistor)

FIG. 14(A1) is a cross-sectional view of a channel protective transistor 810 that is a type of bottom-gate transistor. In FIG. 14(A1), the transistor 810 is formed over a substrate 771. The transistor 810 includes an electrode 746 over the substrate 771 with an insulating layer 772 therebetween. Furthermore, a semiconductor layer 742 is provided over the electrode 746 with an insulating layer 726 therebetween. The electrode 746 can function as a gate electrode. The insulating layer 726 can function as a gate insulating layer.

An insulating layer 741 is provided over a channel formation region in the semiconductor layer 742. An electrode 744a and an electrode 744b which are partly in contact with the semiconductor layer 742 are provided over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for regions of the electrode 744a and the electrode 744b that are in contact with the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

When the source region and the drain region are formed in the semiconductor layer 742, the contact resistance between the semiconductor layer 742, and the electrode 744a and the electrode 744b can be reduced. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as a source region or a drain region in the transistor.

The insulating layer 729 is preferably formed using a material that has a function of preventing or reducing diffusion of impurities into the transistor from the outside. The insulating layer 729 can be omitted as necessary.

A transistor 811 illustrated in FIG. 14(A2) is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is sandwiched between a gate electrode and the back gate electrode. Thus, the back gate electrode can function similarly to the gate electrode. The potential of the back gate electrode may be set equal to the potential of the gate electrode, or may be a ground potential (GND potential) or a given potential. Moreover, by changing the potential of the back gate electrode not in synchronization with but independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. The electrode 723 may be provided between the insulating layer 728 and the insulating layer 729.

In the case where one of the electrode 746 and the electrode 723 is referred to as a "gate electrode", the other is referred to as a "back gate electrode". For example, in the case where the electrode 723 in the transistor 811 is referred to as a "gate electrode", the electrode 746 is referred to as a "back gate electrode". In the case where the electrode 723 is used as a "gate electrode", the transistor 811 can be considered as a kind of top-gate transistor. In some case, one of the electrode 746 and the electrode 723 is referred to as a "first gate electrode", and the other is referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having a high on-state current for its occupation area. That is, the occupation area of the transistor 811 can be small for a required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity or the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with favorable reliability can be achieved. Moreover, a semiconductor device with favorable reliability can be achieved.

FIG. 14(B1) shows a cross-sectional view of a channel-protective transistor 820 that is one of bottom-gate transistors. The transistor 820 has substantially the same structure as the transistor 810 but is different from the transistor 810 in that the insulating layer 741 covers an end portion of the semiconductor layer 742. The semiconductor layer 742 is electrically connected to the electrode 744a in an opening portion formed by removing selected part of the insulating layer 741 which overlaps with the semiconductor layer 742. The semiconductor layer 742 is electrically connected to the electrode 744b in another opening portion formed by removing selected part of the insulating layer 741 which overlaps with the semiconductor layer 742. A region of the insulating layer 741 which overlaps with the channel formation region can function as a channel protective layer.

A transistor 821 illustrated in FIG. 14(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being thinned at the time of forming the electrode 744a and the electrode 744b.

The distance between the electrode 744a and the electrode 746 and the distance between the electrode 744b and the electrode 746 in the transistor 820 and the transistor 821 are larger than those in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be achieved.

A transistor 825 illustrated in FIG. 14(C1) is a channel-etched transistor that is one of bottom-gate transistors. In the transistor 825, the electrode 744a and the electrode 744b are formed without the insulating layer 741. Thus, part of the semiconductor layer 742 that is exposed at the time of forming the electrode 744a and the electrode 744b is etched in some cases. However, since the insulating layer 741 is not provided, the productivity of the transistor can be increased.

A transistor 826 illustrated in FIG. 14(C2) is different from the transistor 825 in that the electrode 723 that can function as a back gate electrode is provided over the insulating layer 729.

(Top-Gate Transistor)

A transistor 842 illustrated as an example in FIG. 15(A1) is one of top-gate transistors. The transistor 842 is different from the transistors 810, 811, 820, 821, 825, and 826 in that the electrode 744a and the electrode 744b are formed after the formation of the insulating layer 729. The electrode 744a and the electrode 744b are electrically connected to the semiconductor layer 742 in opening portions formed in the insulating layer 728 and the insulating layer 729.

Part of the insulating layer 726 that does not overlap with the electrode 746 is removed, and the impurity 755 is introduced into the semiconductor layer 742 using the electrode 746 and the insulating layer 726 that is left as a mask, so that an impurity region can be formed in the semiconductor layer 742 in a self-aligned manner (see FIG. 15(A3)). The transistor 842 includes a region where the insulating layer 726 extends beyond an end portion of the electrode 746. The semiconductor layer 742 in a region into which the impurity 755 is introduced through the insulating layer 726 when the impurity 755 is introduced into the semiconductor layer 742 has a lower impurity concentration than a region into which the impurity 755 is introduced without through the insulating layer 726. Thus, an LDD (Lightly Doped Drain) region is formed in a region of the semiconductor layer 742 that does not overlap with the electrode 746.

A transistor 843 illustrated in FIG. 15(A2) is different from the transistor 842 in that the electrode 723 is included. The transistor 843 includes the electrode 723 that is formed over the substrate 771. The electrode 723 includes a region that overlaps with the semiconductor layer 742 with the insulating layer 772 therebetween. The electrode 723 can function as a back gate electrode.

As in a transistor 844 illustrated in FIG. 15(B1) and a transistor 845 illustrated in FIG. 15(B2), the insulating layer 726 in a region that does not overlap with the electrode 746 may be completely removed. Alternatively, as in a transistor 846 illustrated in FIG. 15(C1) and a transistor 847 illustrated in FIG. 15(C2), the insulating layer 726 may be left.

Also in the transistor 842 to the transistor 847, the impurity 755 is introduced into the semiconductor layer 742 using the electrode 746 as a mask after the formation of the electrode 746, so that an impurity region can be formed in the semiconductor layer 742 in a self-aligned manner. According to one embodiment of the present invention, a transistor with favorable electrical characteristics can be achieved. Furthermore, according to one embodiment of the present invention, a semiconductor device having a high degree of integration can be achieved.

Note that this embodiment can be combined with the other embodiments and/or the examples in this specification as appropriate.

(Embodiment 4)

In this embodiment, the compositions of a CAC-OS (Cloud-Aligned Composite Oxide Semiconductor) and a CAAC-OS (c-axis Aligned Crystalline Oxide Semiconductor), which are metal oxides that can be used in the OS transistor described in the above embodiments, will be described. Note that in the specification and the like, the CAC refers to an example of a function or a material composition, and the CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of the non-single-crystal oxide semiconductors include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of an oxide semiconductor; thus, it can be said that the CAAC-OS is an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, the transistor having high field-effect mobility can be achieved. In addition, the transistor having high reliability can be achieved.

An oxide semiconductor with a low carrier density is preferably used for a transistor. In the case where the carrier density of an oxide semiconductor film is lowered, the impurity concentration in the oxide semiconductor film is reduced to lower the density of defect states. In this specification and the like, a state with a low impurity concentration and a low density of defect states is referred to as a highly purified intrinsic or substantially highly purified intrinsic state. For example, the carrier density of the oxide semiconductor is lower than $8 \times 10^{11}/\text{cm}^3$, preferably lower than $1 \times 10^{11}/\text{cm}^3$, further preferably lower than $1 \times 10^{10}/\text{cm}^3$, and greater than or equal to $1 \times 10^{-9}/\text{cm}^3$.

In addition, a highly purified intrinsic or substantially highly purified intrinsic oxide semiconductor film has a low density of defect states and accordingly has a low density of trap states in some cases.

Furthermore, charges trapped by the trap states in the oxide semiconductor take a long time to disappear and may behave like fixed charges. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferred that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are each lower than or equal to $2 \times 10^{18}$ atoms/cm$^3$, preferably lower than or equal to $2 \times 10^{17}$ atoms/cm$^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferred to reduce the concentration of an alkali metal or an alkaline earth metal in the oxide semiconductor. Specifically, the concentration of an alkali metal or an alkaline earth metal in the oxide semiconductor obtained by SIMS is set lower than or equal to $1 \times 10^{18}$ atoms/cm$^3$, preferably lower than or equal to $2 \times 10^{16}$ atoms/cm$^3$.

Furthermore, when containing nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor obtained by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor with sufficiently reduced impurities is used for a channel formation region of a transistor, stable electrical characteristics can be given.

Note that this embodiment can be combined with the other embodiments and/or the examples in this specification as appropriate.

(Embodiment 5)

In this embodiment, examples of a product in which the semiconductor device or the display device described in the above embodiments is used for an electronic device will be described.

<Laptop Personal Computer>

Figure 16A:
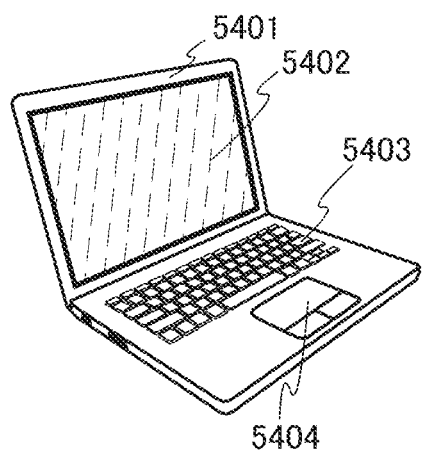
FIGS. 16A-16F Perspective views showing examples of an electronic device.

The semiconductor device or the display device of one embodiment of the present invention can be used for a display provided in an information terminal device. FIG. 16(A) is a laptop personal computer that is a kind of information terminal device. The laptop personal computer includes a housing 5401, a display portion 5402, a keyboard 5403, a pointing device 5404, and the like.

<Smart Watch>

Figure 16B:
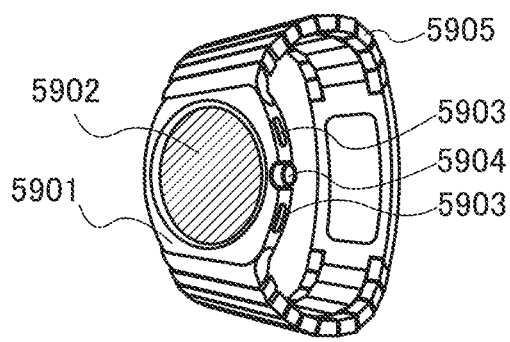

The semiconductor device or the display device of one embodiment of the present invention can be used for a wearable terminal. FIG. 16(B) is a smart watch that is a kind of wearable terminal, and includes a housing 5901, a display portion 5902, operation buttons 5903, an operator 5904, a band 5905, and the like. A display device with a function of a position input device may be used for the display portion 5902. The function of the position input device can be added by provision of a touch panel in a display device. Alternatively, the function of the position input device can be added by provision of a photoelectric conversion element also called a photosensor in a pixel portion of a display device. As the operation buttons 5903, any of a power switch for activating the smart watch, a button for operating an application of the smart watch, a volume control button, a switch for turning on or off the display portion 5902, and the like can be provided. Although the smart watch illustrated in FIG. 16(B) includes two operation buttons 5903, the number of operation buttons included in the smart watch is not limited thereto. The operator 5904 functions as a crown used for setting the time on the smart watch. The operator 5904 may be used as an input interface for operating an application of the smart watch as well as the crown for time adjustment. Although the smart watch shown in FIG. 16(B) includes the operator 5904, one embodiment of the present invention is not limited thereto and does not necessarily include the operator 5904.

<Video Camera>

Figure 16C:
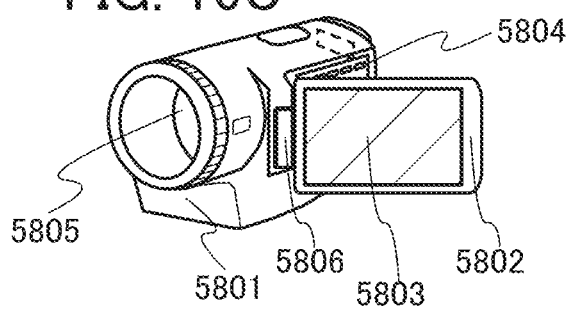

The semiconductor device or the display device of one embodiment of the present invention can be used for a video camera. A video camera shown in FIG. 16(C) includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images on the display portion 5803 may be changed in accordance with the angle at the joint 5806 between the first housing 5801 and the second housing 5802.

<Mobile Phone>

Figure 16D:
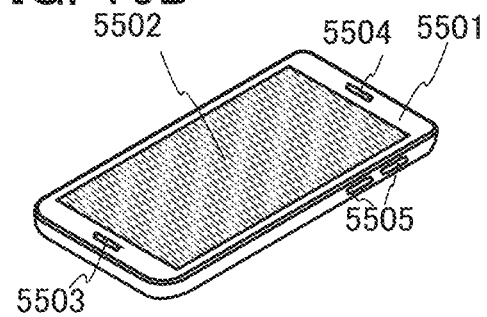

The semiconductor device or the display device of one embodiment of the present invention can be used for a mobile phone. FIG. 16(D) is a mobile phone having a function of an information terminal, and includes a housing 5501, a display portion 5502, a microphone 5503, a speaker 5504, and operation buttons 5505. A display device with a function of a position input device may be used for the display portion 5502. The function of the position input device can be added by provision of a touch panel in a display device. Alternatively, the function of the position input device can be added by provision of a photoelectric conversion element also called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the mobile phone shown in FIG. 16(D) includes two operation buttons 5505, the number of operation buttons included in the mobile phone is not limited thereto. Although not illustrated, the mobile phone shown in FIG. 16(D) may include a light-emitting device used for a flashlight or a lighting purpose.

<Television Device>

Figure 16E:
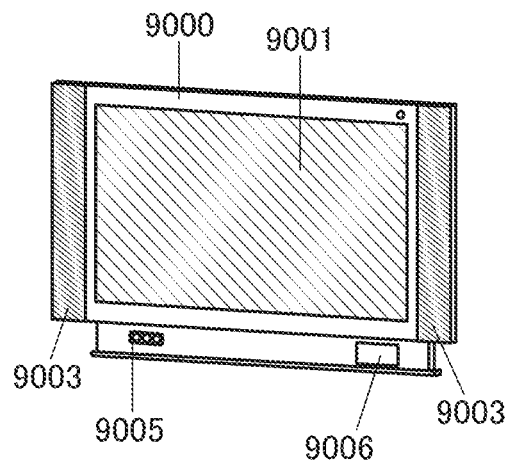

The semiconductor device or the display device of one embodiment of the present invention can be used for a television device. FIG. 16(E) shows a television device including a housing 9000, a display portion 9001, a speaker 9003, an operation key 9005 (including a power switch or an operation switch), a connection terminal 9006, and the like. The television device can include the display portion 9001 having a large screen size of 50 inches or more or 100 inches or more, for example.

<Vehicle>

The semiconductor device or the display device of one embodiment of the present invention can be used around a driver's seat in a car, which is a vehicle.

Figure 16F:
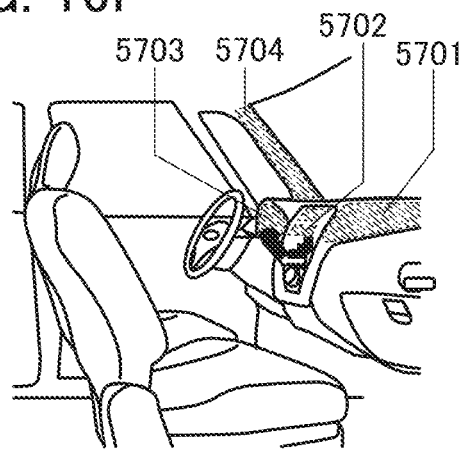

For example, FIG. 16(F) illustrates a windshield and its vicinity inside a car. FIG. 16(F) shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying navigation information, a speedometer, a tachometer, a mileage, a fuel meter, a gearshift indicator, and air-condition setting. Items shown on the display panel, their layout, and the like can be changed as appropriate to suit the user's preferences, resulting in more sophisticated design. The display panel 5701 to the display panel 5703 can also be used as lighting devices.

The display panel 5704 can compensate for the view obstructed by the pillar (blind areas) by showing an image taken by an imaging unit provided for the car body. That is, displaying an image taken by the imaging unit provided on the outside of the car body leads to elimination of blind areas and enhancement of safety. Moreover, showing an image to compensate for the area that a driver cannot see allows confirming the safety more naturally and comfortably. The display panel 5704 can also be used as a lighting device.

<Electronic Device for Electronic Advertisement>

Figure 17A:
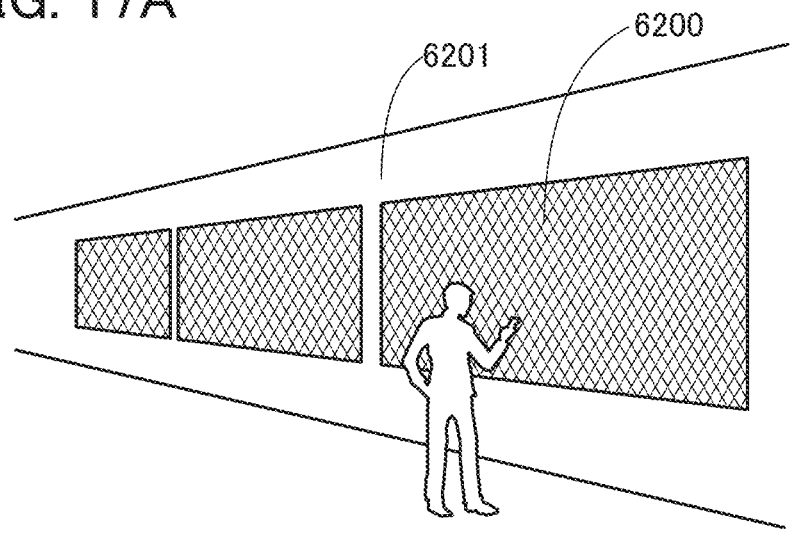
FIGS. 17A-17B Perspective views showing examples of an electronic device.

The semiconductor device or the display device of one embodiment of the present invention can be used for a display used for an electronic advertisement. FIG. 17(A) shows an example of digital signage that can be attached to a wall. FIG. 17(A) shows a digital signage 6200 attached to a wall 6201.

<Foldable Tablet Information Terminal>

Figure 17B:
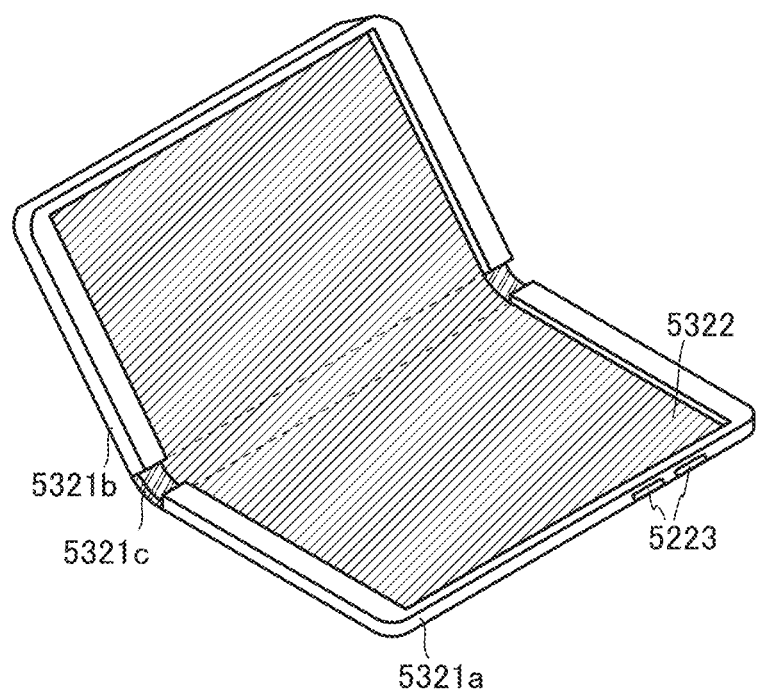

The semiconductor device or the display device of one embodiment of the present invention can be used for a tablet information terminal. FIG. 17(B) shows a foldable tablet information terminal. The information terminal shown in FIG. 17(B) includes a housing 5321a, a housing 5321b, a display portion 5322, and operation buttons 5323. In particular, a flexible base included in the display portion 5322 allows a foldable structure to be achieved.

The housing 5321a and the housing 5321b are connected to each other with a hinge portion 5321c that allows the display portion 5322 to be folded in half. The display portion 5322 is provided in the housing 5321a, the housing 5321b, and the hinge portion 5321c.

Although not illustrated, each of the electronic devices shown in FIGS. 16(A) to 16(C) and 16(E) and FIGS. 17(A) and 17(B) may have a structure with a microphone and a speaker. The electronic devices with this structure can have an audio input function, for example.

Although not illustrated, the electronic devices shown in FIGS. 16(A), 16(B), and 16(D) and FIGS. 17(A) and 17(B) may have a structure with a camera.

Although not illustrated, each of the electronic devices shown in FIGS. 16(A) to 16(F) and FIGS. 17(A) and 17(B) may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, infrared rays, or the like) in the housing. In particular, when the mobile phone illustrated in FIG. 16(D) is provided with a sensing device which includes a sensor for sensing inclinations, such as a gyroscope sensor or an acceleration sensor, the orientation of the mobile phone (the orientation of the mobile phone with respect to the vertical direction) is determined and display on the screen of the display portion 5502 can be automatically changed in accordance with the orientation of the mobile phone.

Although not illustrated, each of the electronic devices shown in FIGS. 16(A) to 16(F) and FIGS. 17(A) and 17(B) may include a device for obtaining biological information such as fingerprints, veins, iris, or voice prints. Employing this structure can achieve an electronic device having a biometric identification function.

A flexible base may be used for the display portion of each of the electronic devices shown in FIGS. 16(A) to 16(E) and FIG. 17(A). Specifically, the display portion may have a structure in which a transistor, a capacitor, a display element, and the like are provided over a flexible base. Employing this structure can achieve not only the electronic device having the housing with a flat surface as shown in FIGS. 16(A) to 16(E) and FIG. 17(A) but also an electronic device having a housing with a curved surface like the dashboard and the pillar shown in FIG. 16(F).

As a flexible base that can be used for the display portions in FIGS. 16(A) to 16(F) and FIGS. 17(A) and 17(B), any of the following materials that transmit visible light can be used, for example: a poly(ethylene terephthalate) resin (PET), a poly(ethylene naphthalate) resin (PEN), a poly (ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, and the like. Alternatively, a mixture or a stack including any of these materials may be used.

Note that this embodiment can be combined with the other embodiments and/or the examples in this specification as appropriate.

Example 1

<Calculation and its Result 1>

Calculation with a circuit simulator was performed in order to verify the operation of correcting the threshold voltage of the driving transistor in the circuit configuration of the pixel PIX shown in FIG. 6(A). Here, the threshold voltage of the transistor Tr3, which corresponds to the driving transistor in the pixel PIX, is 0 V, and the amount of change in current flowing to the light-emitting element LD is calculated while the threshold voltage is changed from 0 V intentionally; the result will be described.

A software used in this calculation is a circuit simulator, Gateway (version 3.4.1.R) produced by Silvaco, Inc. The current change rate of the light-emitting element LD with respect to a change in the threshold voltage Vth of the transistor Tr3 is calculated with this simulator. Note that the threshold voltage Vth is changed to the five conditions, −1 V, −0.5 V, 0 V, 0.5 V, and 1 V, and the current change rate with respect to each condition was calculated.

In the calculation conditions, $V_{data}$ corresponding to image data is 5 V and $V_W$ corresponding to correction data is 5 V. As for wirings electrically connected to the pixel PIX, a high-level potential and a low-level potential applied to the wirings GL1 to GL4 are 15 V and −5 V, respectively; the potential of the wiring VL is 0.5 V; the potential of the wiring BGL is −10 V; the potential of the wiring AL is 13 V; and the reference potential $V_{GND}$ applied to the wiring CAT is −4 V.

A current flowing to the light-emitting element LD when the threshold voltage Vth of the transistor Tr3 changes from 0 V is denoted as TEL, a current flowing to the light-emitting element LD when the change in threshold voltage is 0, i.e., when the threshold voltage of the driving transistor is 0, is denoted as $I_{EL0}$, and $I_{EL}-I_{EL0}=\Delta I_{EL}$. The current change rate of the light-emitting element LD is obtained by the calculation, $\Delta I_{EL}/I_{EL} \times 100\%$.

Figure 18:
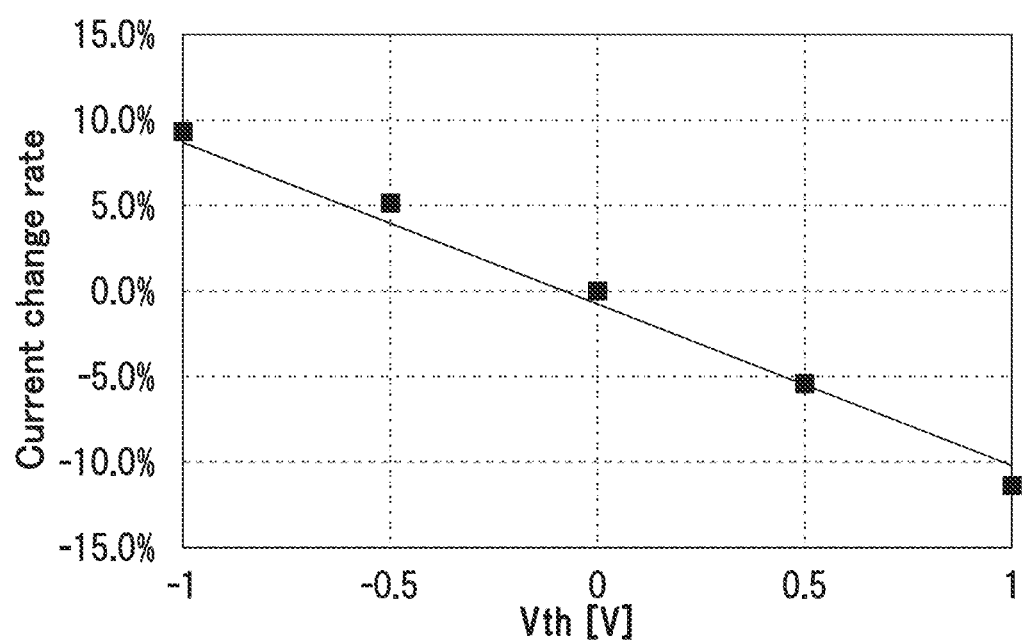
FIG. 18 A graph showing the amount of change in current due to correction of the threshold voltage.

The calculation result is shown in FIG. 18. FIG. 18 shows the current change rate of the light-emitting element LD when the threshold voltage Vth changes from −1 V to 1 V. The calculation result indicates that the current change rate is within approximately −10% to 10% when the threshold voltage Vth is from −1 V to 1 V.

In the case where a transistor operates in a saturation region, the amount of current flowing to the transistor is generally proportional to the square of the difference between a gate-source voltage and a threshold voltage; accordingly, the amount of current flowing to the transistor significantly changes even with a small change in threshold voltage. Meanwhile, in the calculation result for the circuit configuration of the pixel PIX shown in FIG. 6(A), the current change rate is within approximately −10% to 10%, which means that the threshold voltage of the transistor Tr3 is corrected appropriately.

As described above, correction data and image data are written to the pixel PIX in a row while the threshold voltage of the driving transistor in the pixel PIX in another row (from Time T3 to Time T4 in FIG. 8 or during Period PD3 in FIG. 9), whereby the operation frequency of a display device can be increased.

Note that this example can be combined with each embodiment or the other examples in this specification as appropriate.

Example 2

<Calculation and its Result 2>

Next, calculation with a circuit simulator was performed in order to verify the operation of correcting the threshold voltage of the driving transistor in the circuit configuration of the pixel PIX shown in FIG. 6(B). Here, description is made on the result of calculating the amount of current flowing to the light-emitting element LD when the threshold voltage of the transistor Tr3, which corresponds to the driving transistor in the pixel PIX, is corrected.

A software used in this calculation is a circuit simulator, Smartspice (4.26.7.R), which is produced by Silvaco, Inc. as in the above calculation. The threshold voltage of the transistor Tr3 is set to different values in the circuit configuration of the pixel PIX shown in FIG. 6(B), and the amount of current flowing to the light-emitting element LD when the threshold voltage is corrected was calculated with this simulator.

Figure 19:
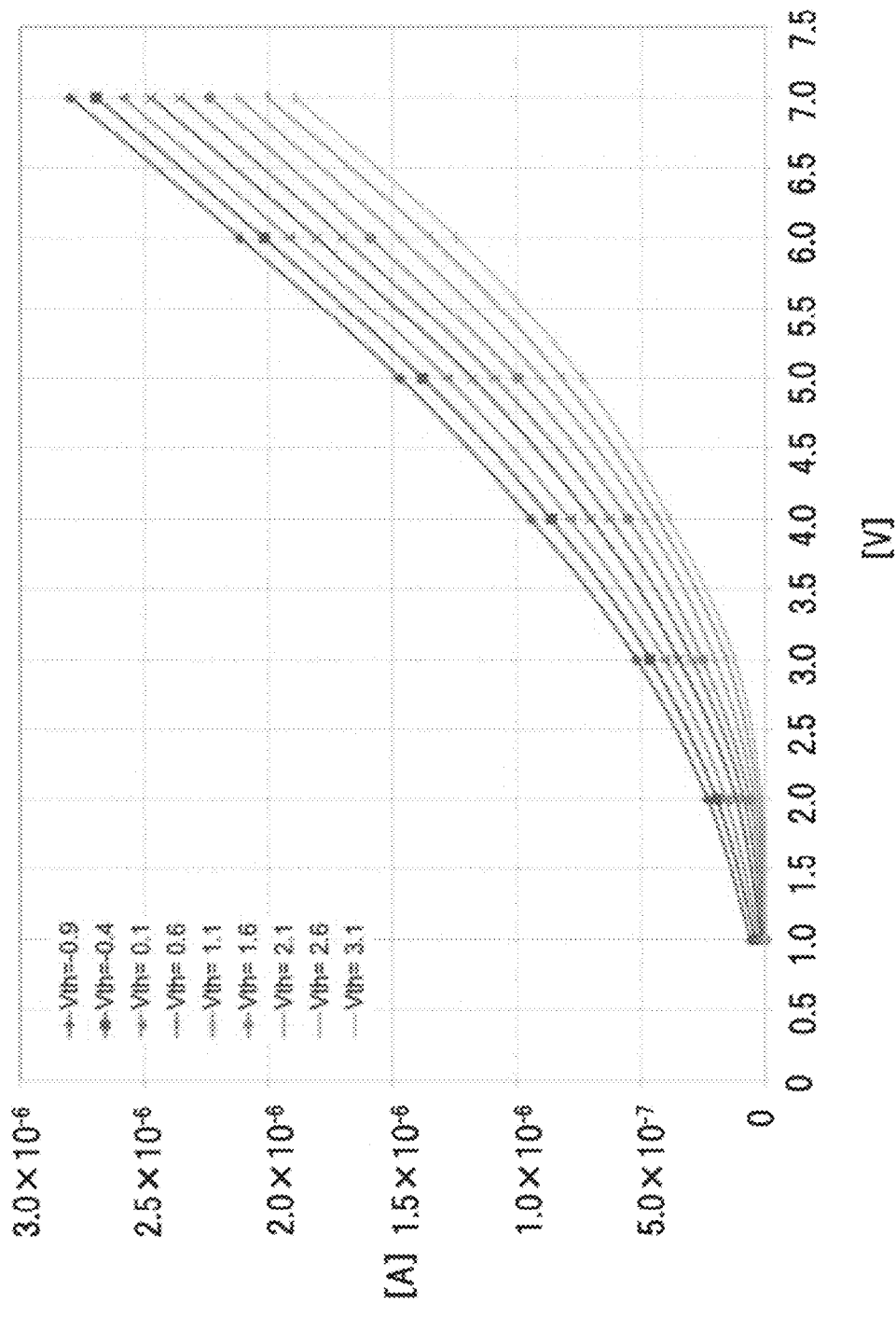
FIG. 19 A graph showing the relation between image data (voltage) and the amount of current flowing in a transistor.

FIG. 19 shows the results of calculation with the circuit simulator; the horizontal axis represents the same voltage (V) (hereinafter referred to as data voltage) input from each of the wiring DL and the wiring WDL to the correction data retention portion (node ND1) and the image data retention portion (node ND2), whereas the vertical axis represents the driving current (A) flowing to the light-emitting element LD.

FIG. 19 shows the case where the threshold voltage of the transistor Tr3 corresponding to the driving transistor has the nine conditions: −0.9 V, −0.4 V, 0.1 V, 0.6 V, 1.1 V, 1.6 V, 2.1 V, 2.6 V, and 3.1 V.

From FIG. 19, in the case where the data voltage is high, e.g., 7.0 V, the amount of current flowing to the driving transistor is within approximately $1.85 \times 10^{-6}$ A to $2.80 \times 10^{-6}$ A in the above nine conditions. With reference to the condition where the threshold voltage of the driving transistor is 1.1 V, the change in the amount of current due to correction is found to be within approximately −20% to 20%.

Note that this example can be combined with each embodiment or the other examples in this specification as appropriate.

Example 3

<Prototype>

A prototype of the display device described in the above embodiment was actually fabricated. Described in this example are the characteristics of transistors included in the display device, the details of the display device, and the measurement results of the luminance of the display device.

Figure 20A:
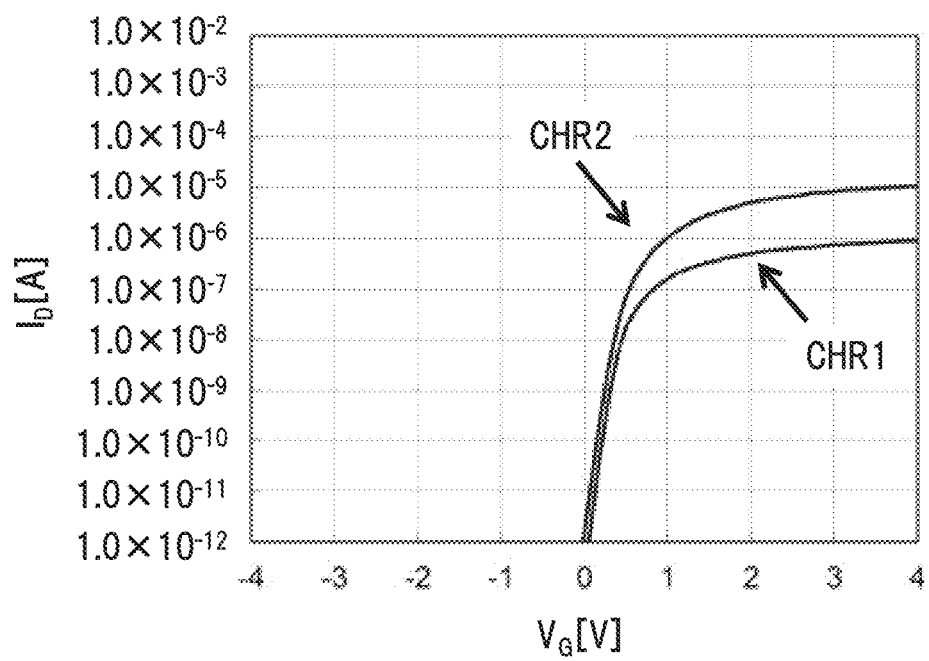
FIGS. 20A-20B Graphs showing the characteristics of a drain current and a gate-source voltage of transistors.
Figure 20B:
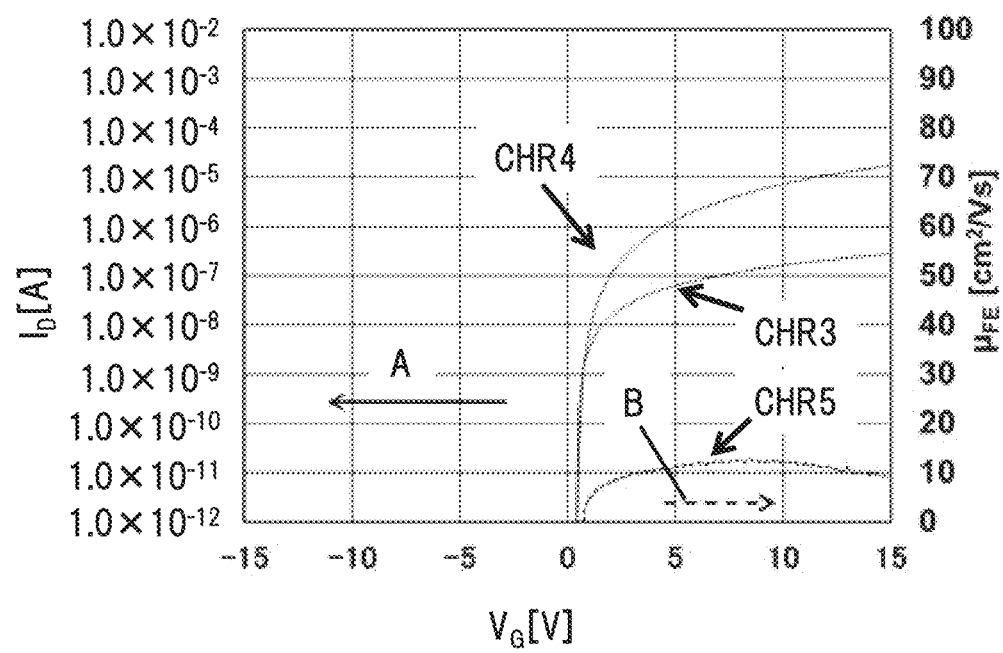

FIGS. 20(A) and 20(B) are graphs showing the characteristics of a drain current ID and a gate-source voltage $V_G$ of an OS transistor including an In—Ga—Zn oxide, which is a CAAC-OS, in a channel formation region. In particular, FIG. 20(A) shows the characteristics of an OS transistor with a channel length of 60 nm and a channel width of 60 nm, which are scales for LSI, and FIG. 20(B) is a graph showing the characteristics of a drain current ID, a gate-source voltage $V_G$, and a field-effect mobility µFE [cm²/VS] of an OS transistor with a channel length of 6 µm and a channel width of 4 µm included in the display device.

In FIG. 20(A), CHR1 and CHR2 are characteristics at a source-drain voltage of 0.1 V and 1.2 V, respectively. As shown in FIG. 20(A), the OS transistor exhibits good properties as scales for LSI, and has an off-state current smaller than the measurement limit.

In FIG. 20(B), CHR3 and CHR4 are characteristics at a source-drain voltage of 0.1 V and 10 V, respectively. Note that the characteristics CHR3 and CHR4 correspond to the vertical axis in the direction of the arrow A. A characteristic CHR5 in FIG. 20(B) shows a gate-source voltage and a field-effect mobility of the OS transistor. Note that the characteristic CHR5 corresponds to the vertical axis in the direction of the arrow B. As shown in FIG. 20(B), the OS transistor exhibits good properties as scales for display devices as well as scales for LSI, and has an off-state current smaller than the measurement limit.

Because having a small off-state current, the OS transistor having the characteristics in FIG. 20(B) can be employed as the transistors Tr1 and Tr2 shown in FIG. 4 and the transistors Tr1, Tr2, and Tr7 shown in FIGS. 6(A) and 6(B). The OS transistor may be employed as all of the transistors Tr1 to Tr4 shown in FIG. 4 and the transistors Tr1 to Tr6 in FIGS. 6(A) and 6(B).

Figure 21:
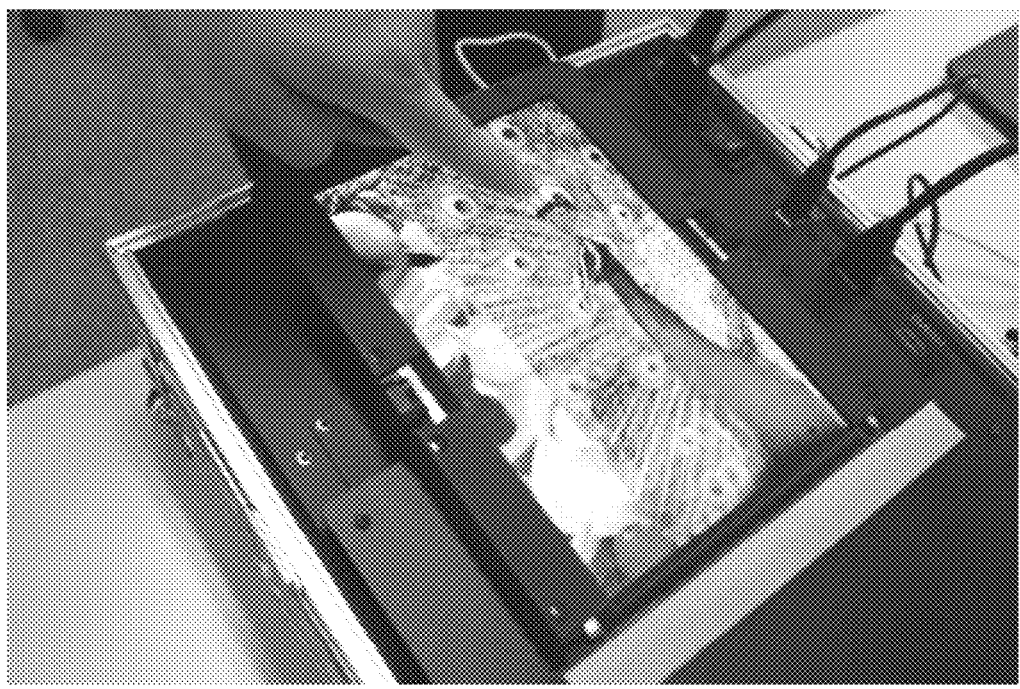
FIG. 21 A photograph of a prototyped display device.

FIG. 21 shows the prototyped display device including the pixel PIX shown in FIG. 6(B). Note that the aforementioned OS transistor is used in the pixel PIX. The display device is fabricated with a flexible substrate and thus, the display portion of the display device can be folded in two.

Specific specifications of the display device are shown in Table below.

TABLE 1

| | |
|---|---|
| Screen diagonal | 8.65 inches |
| Resolution | 1200 × 1920 |
| Pixel size | 96 μm × 96 μm |
| Pixel density | 265 ppi |
| Aperture ratio | 17.4% |
| Coloring Method | Side by side |
| Emission type | Top emission |
| Source driver | COG |
| Scan driver | Integrated with pixel portion |

Table below shows the luminance of the display device in each of the case where full-white image data is retained in the image data retention portion (node ND2) (only image data) and the case where full-white correction data is additionally retained in the correction data retention portion (node ND1) (image data+correction data).

TABLE 2

| | Only image data | Image data + correction data |
|---|---|---|
| Luminance [cd/m$^2$] | 801 | 1145 |

The above table indicates that the luminance of the display device is improved when the image data is retained in the image data retention portion (node ND2) and the correction data is retained in the correction data retention portion (node ND3) compared with the case where the image data is retained in the image data retention portion (node ND2).

When 4% of the whole screen of the display device emits light, the 4% area has a peak luminance of approximately 2000 cd/m$^2$.

As described above, the image data can be displayed with higher luminance when the display device is fabricated using the pixel PIX shown in FIG. 6(B). This is because the correction data is retained in the correction data retention portion (node ND3) of the pixel PIX, and thus, a voltage higher than the output of a source driver included in the display device can be applied to the gate of the driving transistor (transistor Tr3). This eliminates the need for high output voltage of the source driver in the display device, resulting in a reduction in the power consumption of the source driver.

Note that this example can be combined with each embodiment or the other examples in this specification as appropriate.

(Notes on the Description in this Specification and the Like)

The following are notes on the description of structures in Embodiments and Examples in this specification.

<Notes on One Embodiment of the Present Invention Described in Embodiments and Examples>

One embodiment of the present invention can be constituted by appropriately combining the structure described in each embodiment and example with any of the structures described in the other embodiments. In addition, in the case where a plurality of structure examples are described in one embodiment, some of the structure examples can be combined as appropriate.

Note that what is described (or part thereof) in one embodiment or example can be applied to, combined with, or replaced with at least one of another content (or part thereof) in the embodiment or example and what is described (or part thereof) in another embodiment or other embodiments.

Note that in each embodiment or example, a content described in the embodiment or example is a content described with reference to a variety of diagrams or a content described with text in the specification.

Note that by combining a diagram (or part thereof) described in one embodiment or example with at least one of another part of the diagram, a different diagram (or part thereof) described in the embodiment or example, and a diagram (or part thereof) described in another embodiment, other embodiments, or a different example, much more diagrams can be formed.

<Notes on Ordinal Numbers>

In this specification and the like, ordinal numbers such as "first," "second," and "third" are used in order to avoid confusion among components. Thus, the terms do not limit the number of components. Furthermore, the terms do not limit the order of components. In this specification and the like, for example, a "first" component in one embodiment (or example) can be referred to as a "second" component in other embodiments (or examples) or claims. Furthermore, in this specification and the like, for example, a "first" component in one embodiment (or example) can be omitted in other embodiments or claims.

<Notes on the Description for Drawings>

Embodiments (or Examples) are described with reference to drawings. However, the embodiments (or examples) can be implemented with various different modes. It is readily understood by those skilled in the art that modes and details can be changed in various ways without departing from the spirit and scope of the present invention. Thus, the present invention should not be interpreted as being limited to the description of the embodiments (or examples). Note that in the structures of the invention in the embodiments (the structures in the examples), the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. The positional relation between components is changed as appropriate in accordance with a direction in which the components are described. Therefore, the terms for explaining arrangement are not limited to those used in this specification and the like and can be rephrased as appropriate depending on the situation. For example, the expression "an insulator positioned over (on) a top surface of a conductor" can be replaced with the expression "an insulator positioned on a bottom surface of a conductor" when the direction of a drawing showing these components is rotated by 180°.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and does not exclude the case where another component is provided between the insulating layer A and the electrode B.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

In drawings such as perspective views, some components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, expressions "one of a source and a drain" (or a first electrode or a first terminal) and "the other of the source and the drain" (or a second electrode or a second terminal) are used in description of the connection relation of a transistor. This is because a source and a drain of a transistor are interchangeable depending on the structure, operation conditions, or the like of the transistor. Note that the source or the drain of the transistor can also be referred to as a source (drain) terminal, a source (drain) electrode, or the like as appropriate depending on the situation. In this specification and the like, two terminals except a gate are sometimes referred to as a first terminal and a second terminal or as a third terminal and a fourth terminal. Note that in this specification and the like, a channel formation region refers to a region where a channel is formed; this region is formed by application of a potential to the gate, so that current can flow between the source and the drain.

The functions of a source and a drain might be switched when a transistor of opposite polarity is employed or a direction of current flow is changed in circuit operation, for example. Thus, the terms of source and drain are interchangeable for use in this specification and the like.

In this specification and the like, the term such as an "electrode" or a "wiring" does not limit a function of the component. For example, an "electrode" is used as part of a "wiring" in some cases, and vice versa. Furthermore, the term "electrode" or "wiring" can also mean a plurality of "electrodes" and "wirings" formed in an integrated manner.

In this specification and the like, voltage and potential can be interchanged with each other as appropriate. The voltage refers to a potential difference from a reference potential. When the reference potential is a ground potential, for example, the voltage can be replaced by the potential. The ground potential does not necessarily mean 0 V. Potentials are relative values, and the potential applied to a wiring or the like is changed depending on the reference potential, in some cases.

Note that in this specification and the like, the terms "film", "layer", and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, another term without the term "film", "layer", or the like can be used instead depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring", "signal line", "power source line", and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

<Notes on Definitions of Terms>

Definitions of the terms mentioned in the above embodiments and examples will be explained below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, the formation of DOS (Density of States) in the semiconductor, a decrease in carrier mobility, or a decrease in crystallinity may occur, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components; specific examples include hydrogen (contained also in water), lithium, sodium, silicon, boron, phosphorus, carbon, and nitrogen. In the case of an oxide semiconductor, oxygen vacancies may be formed by entry of impurities such as hydrogen. Moreover, in the case where the semiconductor is a silicon layer, examples of an impurity that changes the characteristics of the semiconductor include oxygen, Group 1 elements except hydrogen, Group 2 elements, Group 13 elements, and Group 15 elements.

<<Switch>>

In this specification and the like, a switch is in a conduction state (on state) or in a non-conduction state (off state) to determine whether a current flows or not. Alternatively, a switch has a function of selecting and changing a current path.

As an example, an electrical switch, a mechanical switch, and the like can be used. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (microelectromechanical system) technology, such as a digital micromirror device (DMD). Such a switch includes an electrode which can be moved mechanically, and operates to control conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether a current flows or not.

For example, in the case where X and Y are functionally connected, one or more circuits that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "being electrically connected" is the same as the explicit simple expression "being connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and expressions are not limited to them. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

REFERENCE NUMERALS

DD: display device, PA: display portion, GD: gate driver circuit, SD: source driver circuit, WSD: circuit, PIX: pixel, SR: shift register, LAT: latch circuit, LVS: level shifter circuit, DAC: digital-analog converter circuit, AMP: amplifier circuit, GL: wiring, VA: wiring, DB: data bus wiring, Tr1: transistor, Tr2: transistor, Tr3: transistor, Tr4: transistor, Tr5: transistor, Tr6: transistor, Tr7: transistor, C1: capacitor, C2: capacitor, C3: capacitor, LD: light-emitting element, GL1: wiring, GL2: wiring, GL3: wiring, GL4: wiring, DL: wiring, WDL: wiring, VL: wiring, AL: wiring, BGL: wiring, CAT: wiring, ND1: node, ND2: node, ND3: node, ND4: node, SDa: circuit, WSDa: circuit, Tr11: transistor, Tr12: transistor, Tr13: transistor, Tr14: transistor, SELD: wiring, SELG: wiring, SELV: wiring, SELW: wiring, GNDL: wiring, V1L: wiring, 101: image data retention portion, 102: driver circuit portion, 103: display element, 104: correction data retention portion, 105: threshold voltage correction circuit portion, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 4001: first substrate, 4005: sealant, 4006: second substrate, 4010: transistor, 4011: transistor, 4014: wiring, 4015: electrode, 4017: electrode, 4018: FPC, 4019: anisotropic conductive layer, 4020: capacitor, 4021: electrode, 4030: first electrode layer, 4031: second electrode layer, 4041: printed board, 4042: integrated circuit, 4102: insulating layer, 4103: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition wall, 4511: light-emitting layer, 4513: light-emitting element, 4514: filler, 5321a: housing, 5321b: housing, 5321c: hinge portion, 5322: display portion, 5323: operation button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint, 5901: housing, 5902: display portion, 5903: operation button, 5904: operator, 5905: band, 6200: digital signage, 6201: wall, 9000: housing, 9001: display portion, 9003: speaker, 9005: operation key, 9006: connection terminal

The invention claimed is:

1. A semiconductor device comprising a pixel, the pixel comprising:
an image data retention portion;
a correction data retention portion;
a driver circuit portion including a first transistor;
a display element electrically connected to the first transistor; and
a threshold voltage correction circuit portion,
wherein the first transistor includes a gate and a back gate,
wherein the image data retention portion is configured to retain first image data,
wherein the correction data retention portion is configured to retain correction data and to generate second image data corresponding to the first image data and the correction data when the first image data is retained in the image data retention portion,
wherein the driver circuit portion is configured to generate a first current between a first terminal and a second terminal of the first transistor and to feed the first current to the display element when a first potential corresponding to the second image data is applied to the gate of the first transistor, and
wherein the threshold voltage correction circuit portion is configured to correct a threshold voltage of the first transistor by applying a second potential to the back gate of the first transistor.

2. The semiconductor device according to claim 1, further comprising first to third capacitors,
wherein the image data retention portion includes a second transistor,
wherein the correction data retention portion includes a third transistor,
wherein the threshold voltage correction circuit portion includes a fourth transistor,
wherein a first terminal of the second transistor is electrically connected to a first terminal of the first capacitor,
wherein a first terminal of the third transistor is electrically connected to the gate of the first transistor, a second terminal of the first capacitor, and a first terminal of the second capacitor,
wherein the first terminal of the first transistor is electrically connected to a second terminal of the second capacitor and a first terminal of the third capacitor, and
wherein the back gate of the first transistor is electrically connected to a first terminal of the fourth transistor and a second terminal of the third capacitor.

3. The semiconductor device according to claim 2,
wherein each of the first to fourth transistors includes a metal oxide in a channel formation region.

4. The semiconductor device according to claim 2,
wherein the driver circuit portion further includes a fifth transistor, and
wherein the first terminal of the first transistor is electrically connected to the display element through the fifth transistor.

5. The semiconductor device according to claim 2, further comprising a sixth transistor,
wherein a first terminal of the sixth transistor is electrically connected to the gate of the first transistor, and
wherein a second terminal of the sixth transistor is electrically connected to the first terminal of the first transistor.

6. An electronic device comprising the semiconductor device according to claim 1.

7. A semiconductor device comprising a pixel, the pixel comprising:
an image data retention portion including a second transistor;
a correction data retention portion including a third transistor;
a driver circuit portion including a first transistor;
a display element electrically connected to the first transistor;
a threshold voltage correction circuit portion including a fourth transistor; and
a first capacitor, a second capacitor, and a third capacitor,
wherein the first transistor includes a gate and a back gate,
wherein one of a source and a drain of the second transistor is electrically connected to a first terminal of the first capacitor,
wherein one of a source and a drain of the third transistor is electrically connected to the gate of the first transistor, a second terminal of the first capacitor, and a first terminal of the second capacitor, wherein one of a source and a drain of the first transistor is electrically connected to a second terminal of the second capacitor and a first terminal of the third capacitor, and wherein the back gate of the first transistor is electrically connected to one of a source and a drain of the fourth transistor and a second terminal of the third capacitor.

8. The semiconductor device according to claim 7, wherein each of the first to fourth transistors includes a metal oxide in a channel formation region.

9. The semiconductor device according to claim 7, wherein the driver circuit portion further includes a fifth transistor, and wherein the one of the source and the drain of the first transistor is electrically connected to the display element through the fifth transistor.

10. The semiconductor device according to claim 7, further comprising a sixth transistor, wherein one of a source and a drain of the sixth transistor is electrically connected to the gate of the first transistor, and wherein the other of the source and the drain of the sixth transistor is electrically connected to the one of the source and the drain of the first transistor.

11. An electronic device comprising the semiconductor device according to claim 7.

12. A semiconductor device comprising a pixel, the pixel comprising:
- a second transistor;
- a third transistor;
- a first transistor;
- a display element electrically connected to the first transistor;
- a fourth transistor; and
- a first capacitor, a second capacitor, and a third capacitor, wherein the first transistor includes a gate and a back gate, wherein one of a source and a drain of the second transistor is electrically connected to a first terminal of the first capacitor, wherein one of a source and a drain of the third transistor is electrically connected to the gate of the first transistor, a second terminal of the first capacitor, and a first terminal of the second capacitor, wherein one of a source and a drain of the first transistor is electrically connected to a second terminal of the second capacitor and a first terminal of the third capacitor, and wherein the back gate of the first transistor is electrically connected to one of a source and a drain of the fourth transistor and a second terminal of the third capacitor.

13. The semiconductor device according to claim 12, wherein each of the first to fourth transistors includes a metal oxide in a channel formation region.

14. The semiconductor device according to claim 12, further comprising a fifth transistor, wherein the one of the source and the drain of the first transistor is electrically connected to the display element through the fifth transistor.

15. The semiconductor device according to claim 12, further comprising a sixth transistor, wherein one of a source and a drain of the sixth transistor is electrically connected to the gate of the first transistor, and wherein the other of the source and the drain of the sixth transistor is electrically connected to the one of the source and the drain of the first transistor.

16. An electronic device comprising the semiconductor device according to claim 12.

* * * * *